(12) United States Patent
Kang et al.

(10) Patent No.: US 7,719,905 B2
(45) Date of Patent: May 18, 2010

(54) SEMICONDUCTOR MEMORY DEVICE

(75) Inventors: Hee Bok Kang, Cheongju-si (KR); Suk Kyoung Hong, Gwacheon-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 37 days.

(21) Appl. No.: 12/003,612

(22) Filed: Dec. 28, 2007

(65) Prior Publication Data
US 2008/0285362 A1 Nov. 20, 2008

(30) Foreign Application Priority Data

| May 17, 2007 | (KR) | ............ 10-2007-0048214 |
| May 17, 2007 | (KR) | ............ 10-2007-0048215 |
| Aug. 31, 2007 | (KR) | ............ 10-2007-0088150 |

(51) Int. Cl.
*G11C 7/00* (2006.01)
(52) U.S. Cl. ............. 365/196; 365/189.15; 365/189.17; 365/189.08; 365/205
(58) Field of Classification Search ............ 365/196, 365/189.15, 189.17, 189.08, 205
See application file for complete search history.

(56) References Cited

U.S. PATENT DOCUMENTS

| 4,839,862 | A | * | 6/1989 | Shiba et al. ............ 365/154 |
| 5,475,637 | A | | 12/1995 | Fu et al. |
| 5,682,343 | A | * | 10/1997 | Tomishima et al. ...... 365/63 |
| 5,732,026 | A | * | 3/1998 | Sugibayashi et al. ... 365/189.05 |
| 5,812,458 | A | * | 9/1998 | Gotou ............ 365/185.23 |
| 5,978,255 | A | * | 11/1999 | Naritake ............ 365/149 |
| 6,654,274 | B2 | * | 11/2003 | Kang et al. ............ 365/145 |
| 6,700,812 | B2 | * | 3/2004 | Kang et al. ............ 365/145 |
| 6,707,700 | B2 | * | 3/2004 | Kang ............ 365/145 |
| 6,870,785 | B1 | | 3/2005 | Kang |
| 6,922,352 | B2 | | 7/2005 | Kang |
| 6,967,858 | B2 | | 11/2005 | Kang |
| 6,982,896 | B2 | | 1/2006 | Kang |
| 6,995,998 | B2 | | 2/2006 | Kang |
| 7,190,606 | B2 | * | 3/2007 | Kang ............ 365/145 |

(Continued)

FOREIGN PATENT DOCUMENTS

KR 2004-60181 6/2004

(Continued)

OTHER PUBLICATIONS

Notice of Rejection for Korean Patent Application No. 10-2007-0048214 dated May 28, 2008.

(Continued)

*Primary Examiner*—Viet Q Nguyen
(74) *Attorney, Agent, or Firm*—IP & T Law Firm PLC

(57) ABSTRACT

A semiconductor memory device has a memory cell having a hierarchical bit line structure for large capacity even in a small cell size. The semiconductor memory device comprises a unit cell configured to read/write data, a cell data sensing unit configured to adjust a current amount of a main bit line depending on a sensing voltage of a sub bit line when data are sensed, and a write control unit configured to store data in the corresponding unit cell depending on a current level applied from the main bit line to the sub bit line.

24 Claims, 33 Drawing Sheets

U.S. PATENT DOCUMENTS 7,200,028 B2 * 4/2007 Yamamura .................. 365/145

FOREIGN PATENT DOCUMENTS

| KR | 10-2005-0094123 A | 9/2005 |
| --- | --- | --- |
| KR | 10-2005-0106222 A | 11/2005 |
| KR | 2005-109811 | 11/2005 |

OTHER PUBLICATIONS

Notice of Rejection from Korean Intellectual Property Office dated May 28, 2008 in related Korean Application No. 10-2007-0088150.

* cited by examiner

SEMICONDUCTOR MEMORY DEVICE

This application is based upon and claims the benefit of priority to Korean Patent Application Nos. 10-2007-0048214, 10-2007-0048215, filed on May 17, 2007, and 10-2007-0088150, filed on Aug. 31, 2007. The entire contents of these applications are incorporated herein by reference.

TECHNICAL FIELD

Embodiments consistent with the present invention generally relate to a semiconductor memory device, and more specifically, to a semiconductor memory device including a memory cell having a hierarchical bit line structure for large capacity of memory.

BACKGROUND

A semiconductor memory device typically includes a plurality of unit cells for storing a plurality of data. A DRAM, which is a widely used semiconductor memory device, includes a capacitor configured to accumulate charges therein for storing data. In the DRAM, a unit cell includes a capacitor and a MOS transistor serving as a switch.

Due to development of semiconductor techniques, a memory device has been manufactured to operate at a high speed for high integration. Specifically, for high integration of the DRAM, it is necessary to reduce an area of a cell block consisting of a plurality of unit cells occupying the area.

The capacitor is configured to accumulate the minimum charge amount so that data may be maintained. Since the charge amount stored in the capacitor is very small, a bit line sense amplifier unit amplifies a signal for maintaining data stored in the unit cell and outputs the signal externally.

A memory cell array having an open bit line structure has been used where a unit cell corresponds to a bit lint sense amplifier. However, due to high integration of the DRAM, it is difficult to arrange a unit cell including a capacitor and a MOS transistor corresponding to a bit line sense amplifier including four MOS transistors.

In the memory cell array having an open bit line structure, a bit line BL connected to the bit line sense amplifier is connected to a cell block. A bit line bar /BL connected to the bit line sense amplifier is connected to the other cell block. As a result, an area occupied by the bit line sense amplifier may be increased in the memory cell array.

In order to reduce the area, a folded bit line structure has been suggested where a bit line sense amplifier is connected to two unit cells. The folded bit line structure refers to a structure where a bit line BL is arranged in parallel to a bit line bar /BL and a bit line sense amplifier is connected to two unit cells.

FIG. 1 is a circuit diagram illustrating a cell array of a general DRAM. FIG. 1 shows a folded bit line structure and a latch-type bit line sense amplifier.

A unit cell C of a DRAM includes a NMOS transistor T1 regulated by a word line WL0 and a capacitor C1. The NMOS transistor T1 has a drain connected to a bit line BL, and a source connected to an electrode of the capacitor C1. One electrode of capacitor C1 is defined by a storage node SN where written charges are stored.

The other electrode of capacitor C1 is connected to a common cell plate line PL to receive a cell plate voltage VCP. Cell plate voltage VCP is defined by a half power voltage VDD. Power voltage VDD is defined by a high operating voltage of the cell.

Both output terminals of the latch-type bit line sense amplifier are connected to paired bit lines BL, /BL. When word line WL0 is activated to transmit cell data into true bit line BL, complement bit line /BL supplies a reference voltage REF. When a word line WL1 is activated to transmit cell data into the complement bit line /BL, true bit line BL supplies reference voltage REF.

A pair of local data buses LDB, LDBB are configured to input/output data of a data buffer and the bit line sense amplifier S/A.

FIG. 2 is a circuit diagram illustrating a latch-type bit line sense amplifier of a general DRAM.

The latch-type bit line sense amplifier includes equalizing units 10, 22, bit line selecting units 12, 18, a bit line precharging unit 14, an amplifying unit 16 and a selecting unit 20.

Equalizing units 10, 22 are configured to equalize a voltage between the paired bit lines BL, /BL in response to a bit line equalizing signal BLEQ. Bit line selecting units 12, 18 are configured to exchange data between paired bit lines BL, /BL with amplifying unit 16 in response to bit line selecting signals BISH, BISL.

Bit line precharging unit 14 supplies a bit line precharge voltage VBLP to paired bit lines BL, /BL with bit line equalizing signal BLEQ so as to precharge paired bit lines BL, /BL. Bit line precharge voltage VBLP is defined by a half power voltage VDD.

A pull-up activating terminal of amplifying unit 16 is regulated by a control signal SAP, and a pull-down activating terminal is regulated by a control signal SAN. Amplifying unit 16 senses and amplifies data applied to paired bit lines BL, /BL. Selecting unit 20 controls input/output operations of data between bit line sense amplifier unit 16 and paired local data buses LDB, LDBB in response to a column selecting signal YI.

FIG. 3 is a timing diagram illustrating a cell array and a sensing-related operation of a general DRAM.

In a precharge period t0, a voltage of paired bit lines BL, /BL and bit line sense amplifier control signals SAN, SAP are precharged to bit line precharge voltage VBLP. Bit line precharge voltage VBLP is defined by half power voltage VDD and by a half voltage value of a cell high voltage VDD.

In a period t1 for charge sharing, word line WL is activated to transmit cell data into paired bit lines BL, /BL.

In a period t2 for sensing and amplifying data, control signal SAN for amplifying data of paired bit lines BL, /BL transits to a ground voltage, and control signal SAP transits to cell high voltage VDD. Paired bit lines BL, /BL are amplified to cell high voltage VDD and the ground voltage.

In a period t3 for restoring data, the data amplified in paired bit lines BL, /BL are re-written in the cell. After the restoring operation, a precharge period t4 starts.

A DRAM having a 1-Transistor 1-Capacitor (1T1C) structure reads/writes data using a voltage sensing method. A charge and discharge voltage difference in the bit lines is sensed to sense data. By pull-up/pull-down operations of voltages, data are written in the memory cell to cause a swing operation of a main bit line voltage. As a result, the sensing speed of data is degraded, and a large current is required when data are sensed.

SUMMARY

Consistent with the present invention, there is provided a semiconductor memory device comprising a capacitor and a switching element and configured to perform read/write operations of data, the memory device comprising a sub-cell array having a hierarchical bit line structure including a main bit line and a sub bit line connected to a plurality of unit cells for storing the data, wherein the sub-cell array includes, a sensing adjusting unit configured to adjust the current of the main bit line depending on the sensing voltage of the sub bit line when the data are sensed, the plurality of unit cells each configured to read/write the data, and a restoring and writing adjusting unit configured to selectively control a current received from the main bit line to the sub bit line so as to store the data in the corresponding unit cell.

Consistent with the present invention, there is also provided a semiconductor memory device comprising a unit cell configured to read/write data, a cell data sensing unit configured to adjust regulating a current amount of a main bit line depending on a sensing voltage of a sub bit line when the data are sensed, and a write control unit configured to store the data in the corresponding unit cell depending on a current level applied from the main bit line to the sub bit line.

Consistent with the present invention, there is also provided a semiconductor memory device comprising a capacitor and a switching element and configured to perform read/write operations of data, the memory device comprising, a sub-cell array having a hierarchical bit line structure including a main bit line and a sub bit line connected to a plurality of unit cells for storing the data, wherein the sub cell array includes a sensing adjusting unit configured to sense a plurality of sensing currents applied to the main bit line depending on a plurality of sensing voltages applied to the sub bit line when multi data having a multi levels are sensed, the plurality of unit cells each configured to read/write the multi data, and a restoring and writing adjusting unit configured to selectively apply a multi level current to the sub bit line depending on a plurality of write voltages applied to the main bit line so as to store the multi data in the corresponding unit cell.

Consistent with the present invention, there is also provided a semiconductor memory device comprising a unit cell configured to read/write data through a ferroelectric capacitor, a cell data sensing unit configured to adjust a current amount of a main bit line depending on a sensing voltage of a sub bit line when the data are sensed, a write control unit configured to store the data in the corresponding unit cell depending on a current level applied from the main bit line to the sub bit line, and a sense amplifier configured to compare and amplify a reference current with a data current received from the main bit line.

Consistent with the present invention, there is also provided a semiconductor memory device comprising a unit cell configured to read/write of multi level data having a multi levels through a ferroelectric capacitor, a cell data sensing unit configured to adjust a plurality of sensing current applied to a main bit line depending on a plurality of sensing voltages applied to a sub bit line when the multi level data are sensed so as to induce a sensing voltage of the main bit line, a write control unit configured to selectively transmit a multi level current into the sub bit line depending on a plurality of write voltages received from the main bit line so as to store the multi level data in the corresponding unit cell, and a plurality of sense amplifiers each configured to compare and amplify a plurality of reference currents with the plurality of sensing currents received from the main bit line.

DETAILED DESCRIPTION

Figure 1:
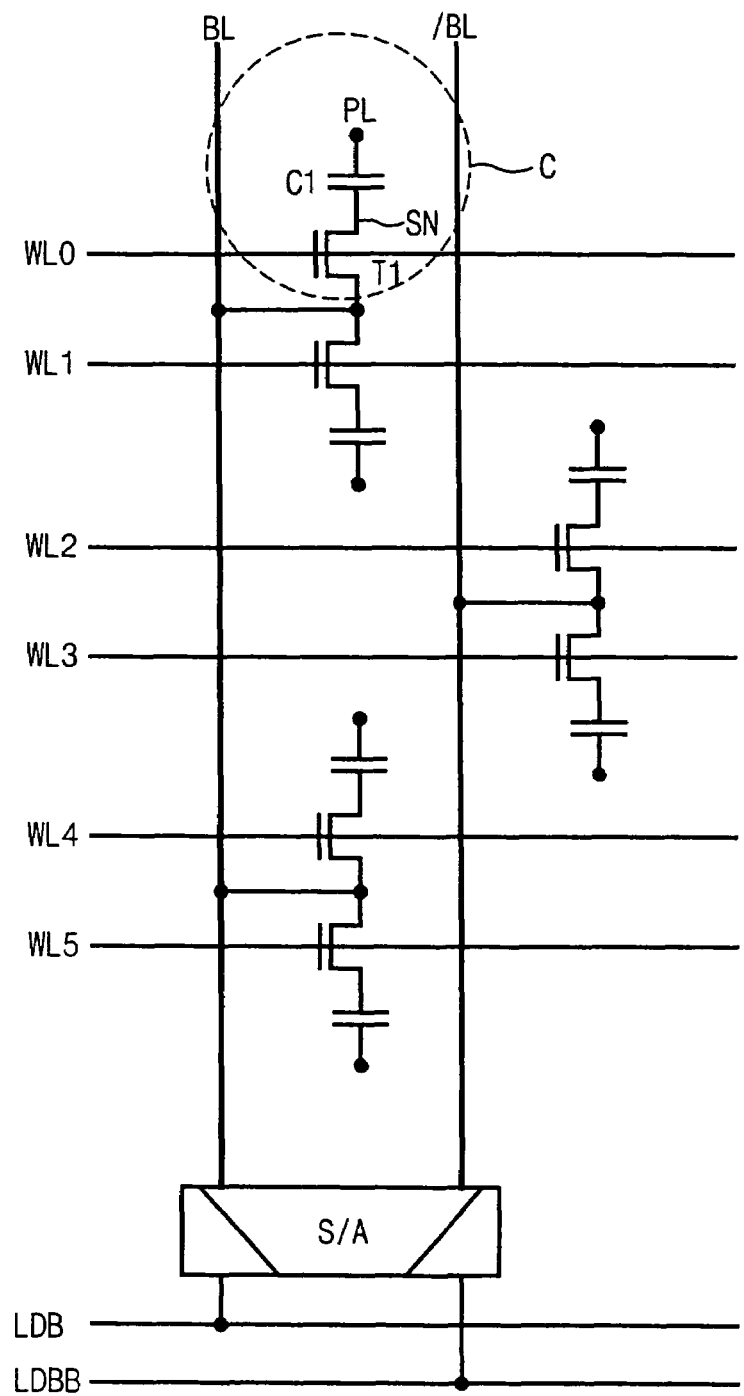
FIG. 1 is a circuit diagram illustrating a cell array of a general DRAM.
Figure 2:
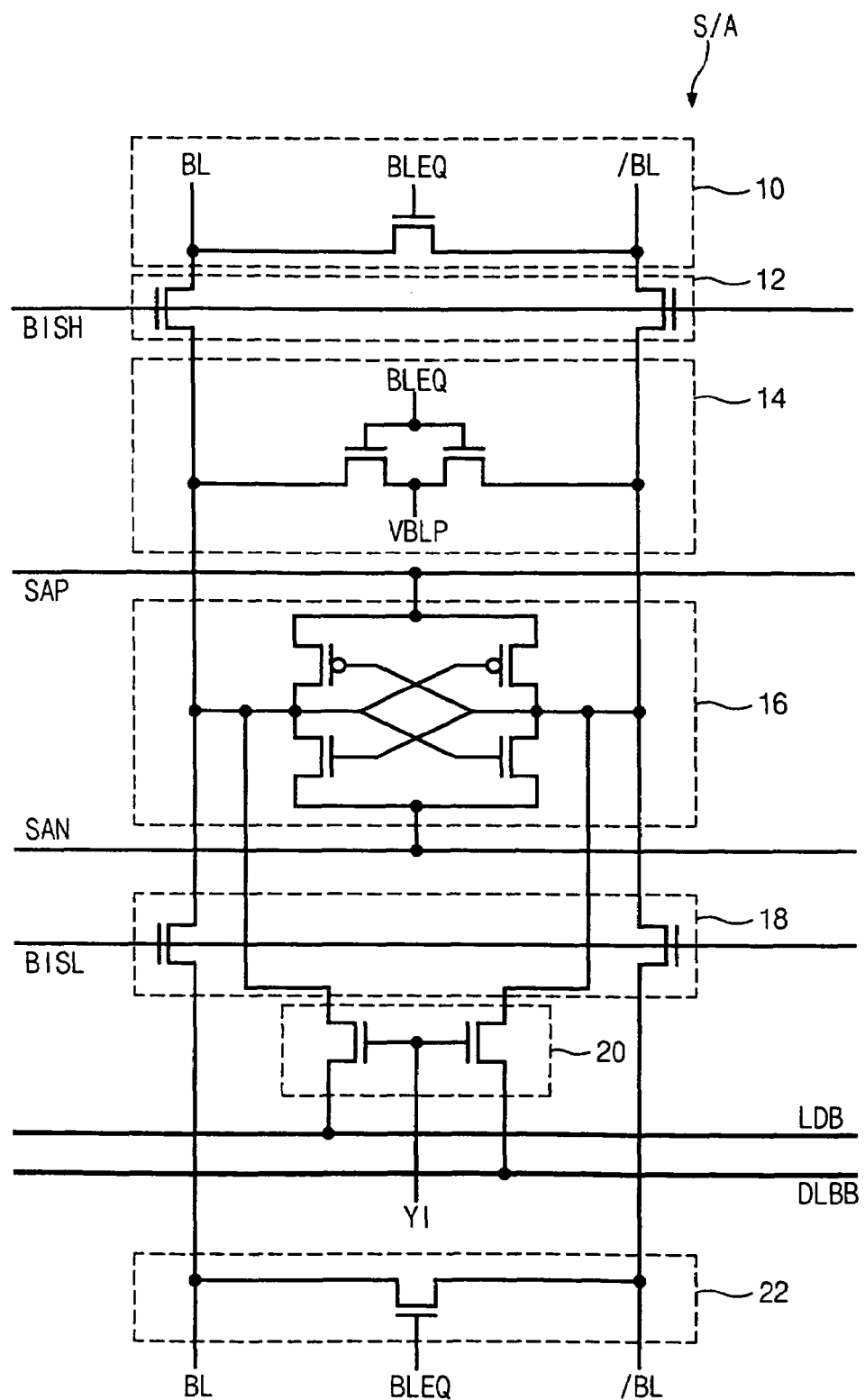
FIG. 2 is a circuit diagram illustrating a latch-type bit line sense amplifier of a general DRAM.
Figure 3:
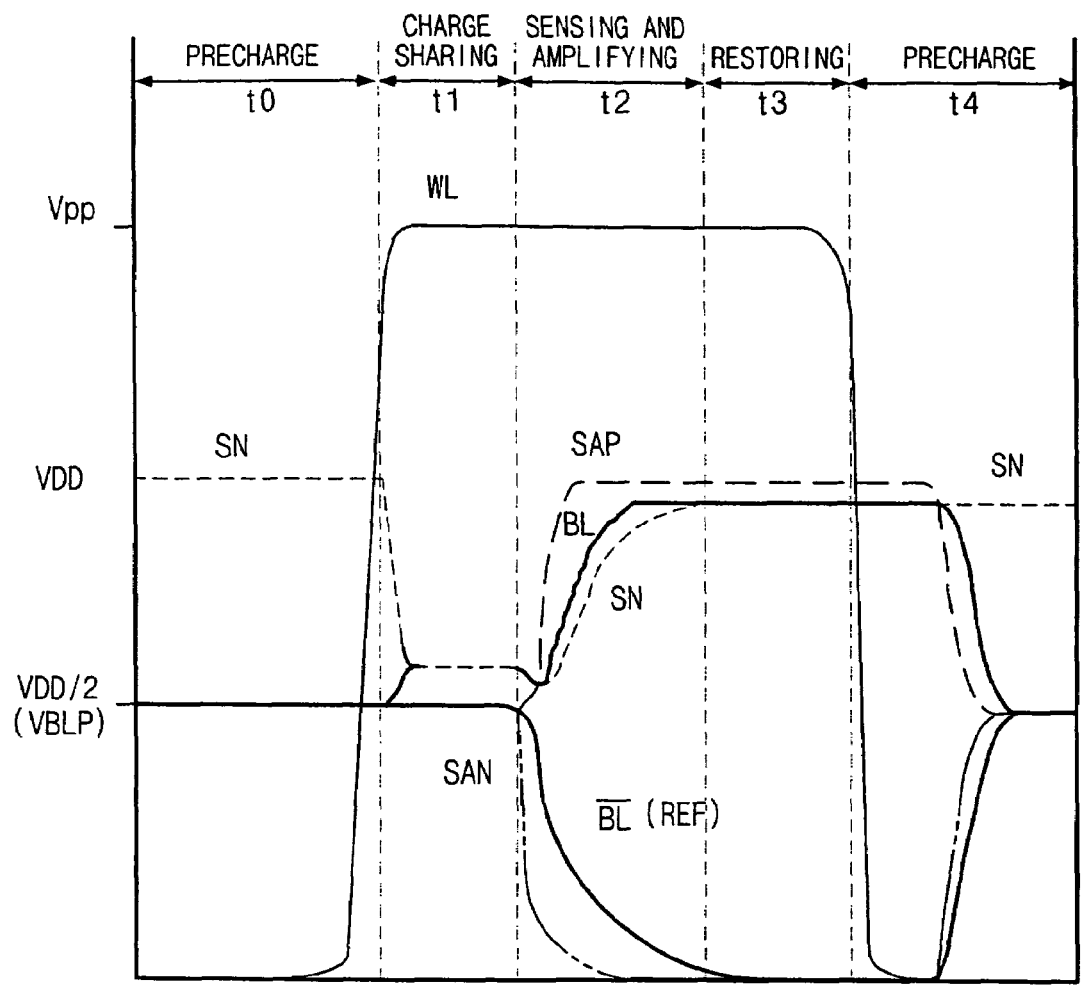
FIG. 3 is a timing diagram illustrating a cell array and a sensing-related operation of a general DRAM.
Figure 4:
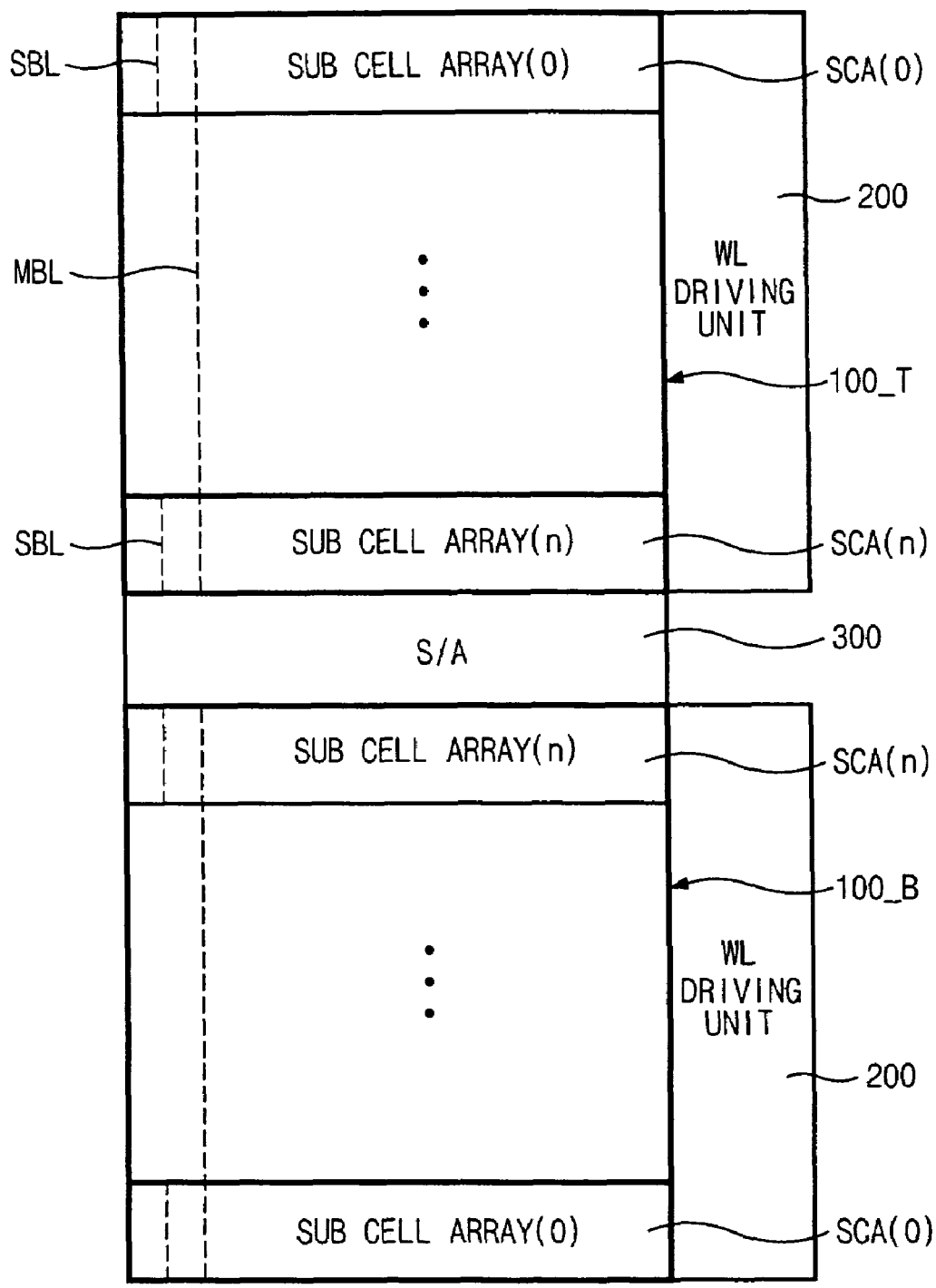
FIG. 4 is a diagram illustrating a semiconductor memory device consistent with the present invention.

FIG. 4 is a diagram illustrating a semiconductor memory device.

The semiconductor memory device of FIG. 4 comprises a top cell array block 100_T, a bottom cell array block 100_B, a word line driving unit 200 and a sense amplifier 300.

Top cell array block 100_T and bottom cell array block 100_B are symmetrically oriented above and below sense amplifier 300. Each of top cell array block 100_T and bottom cell array block 100_B comprises a plurality of sub-cell arrays SCA(0)~SCA(n).

Each of top cell array block 100_T and bottom cell array block 100_B includes a main bit line MBL and a sub bit line SBL. Sub bit line SBL is disposed in each of sub-cell arrays SCA(0)~SCA(n), and main bit line MBL is shared by plurality of sub-cell arrays SCA(0)~SCA(n).

Main bit line MBL in each of sub-cell arrays SCA(0)~SCA(n) corresponds one-to-one or one-to-more to sub bit line SBL. A sensing voltage of main bit line MBL may be induced depending on cell data of sub bit line SBL. That is, each sub-cell array SCA has a double bit line sensing signal transmitting structure to generate a sensing voltage in main bit line MBL by a current amount applied to main bit line MBL depending on the cell data applied to sub bit line SBL.

Main bit line MBL of each of sub-cell arrays SCA(0)~SCA(n) is connected to current sense amplifier 300. Sense amplifier 300 senses a current flowing in main bit line MBL to distinguish data "0" from data "1". That is, sense amplifier 300 may be shared by main bit lines MBL of top cell array block 100_T and bottom cell array block 100_B, and configured to amplify the sensing voltage applied to top/bottom main bit line MBL in response to the sensing signal.

Word line driving unit 200 is configured to selectively activate word lines WL of top cell array block 100_T and bottom cell array block 100_B so as to control read/write operations of the cell data.

Sub-cell array SCA has a hierarchical bit line structure including a main bit line MBL and a sub bit line SBL. Sub-cell array SCA adjusts the current amount transmitted into main bit line MBL depending on the sensing voltage of sub bit line SBL to receive the cell data to induce the sensing voltage of main bit line MBL.

Figure 5:
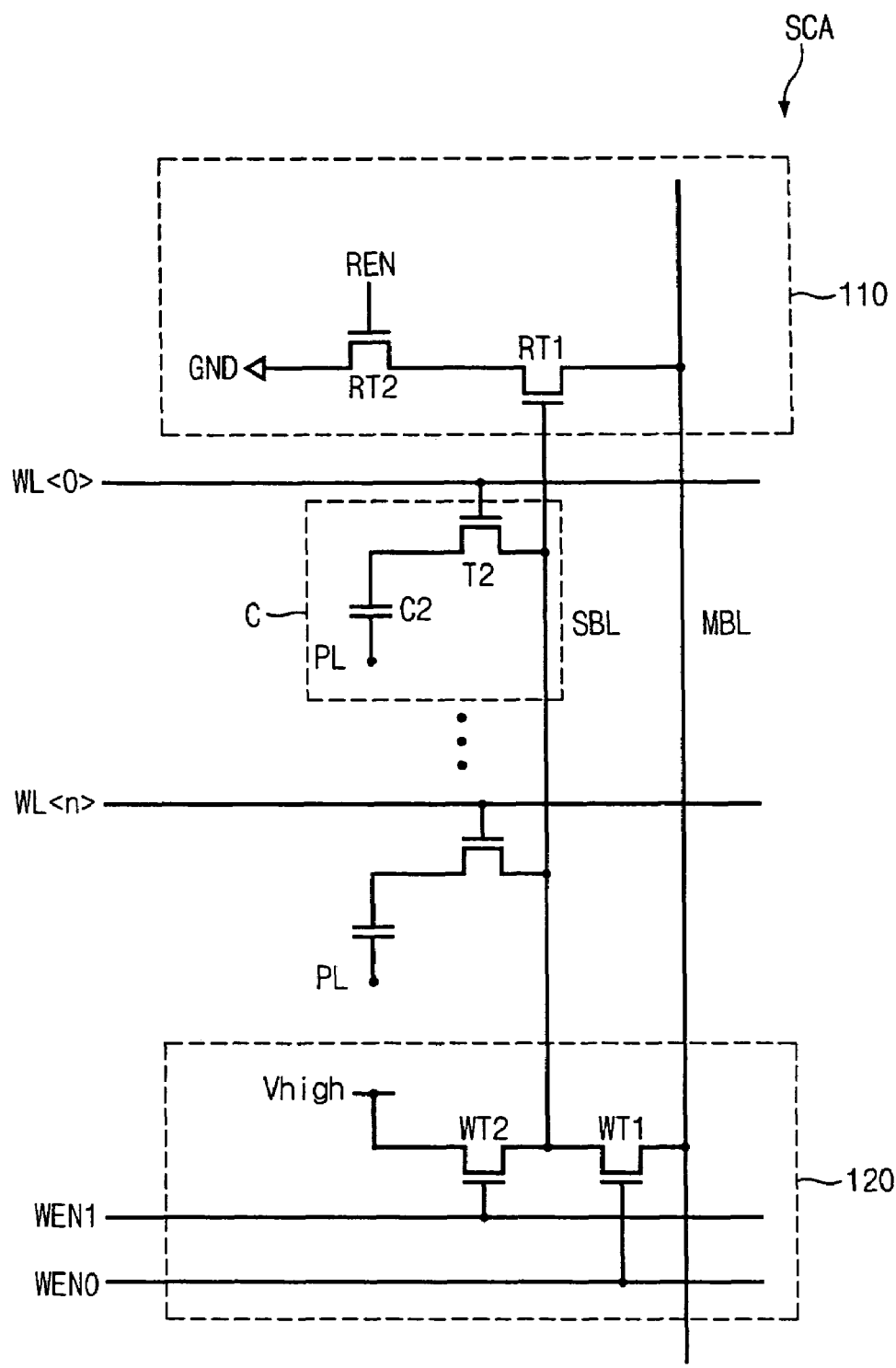
FIG. 5 is a circuit diagram illustrating a sub-cell array of FIG. 4 consistent with the present invention.

FIG. 5 is a circuit diagram illustrating the sub-cell array SCA of FIG. 4 consistent with the present invention.

Sub-cell array SCA comprises a sensing adjusting unit 110, which is a cell data sensing unit, a plurality of unit cells and a restore/write adjusting unit 120, which is a write control unit.

Sensing adjusting unit 110 includes switching elements RT1, RT2 connected serially. Switching elements RT1, RT2 may comprise NMOS transistors. NMOS transistor RT1, which may be a sensing unit, is connected between NMOS transistor RT2 and main bit line MBL, and has a gate connected to sub bit line SBL. NMOS transistor RT2, connected between a ground GND voltage terminal and NMOS transistor RT1, has a gate to receive a read enable signal REN. Read enable signal REN adjusts activation of a read current.

Each of sub-cell arrays SCA(0)~SCA(n) has a plurality of memory cells C connected to sub bit line SBL for storing data. A sub bit line SBL is connected to the plurality of unit cells.

Each of the unit cells may comprise a switching transistor T2 and a capacitor C2 to have a 1T1C structure.

Switching transistor T2, connected between sub bit line SBL and capacitor C2, performs a switching operation depending on a voltage of word line WL to adjust the sensing voltage of main bit line MBL. Capacitor C2 is connected between switching transistor T2 and a plate line PL. Sub bit line SBL has a terminal connected to the gate of NMOS transistor RT1, and another terminal connected to restore/write adjusting unit 120.

Restore/write adjusting unit 120 includes switching elements WT1, WT2 connected serially. Switching elements WT1, WT2 may comprise NMOS transistors. NMOS transistor WT1, connected between sub bit line SBL and main bit line MBL, has a gate to receive a write enable signal WEN0. NMOS transistor WT2, which is a voltage supplying unit, is connected between a high voltage Vhigh terminal and NMOS transistor Wt1, and has a gate to receive a write enable signal WEN1.

A high voltage Vhigh means a cell activating voltage for storing "high data" of the cell data. High voltage Vhigh may be generated by a high voltage generating unit to supply a high voltage to a bank including the unit cell in a write mode. Write enable signals WEN0, WEN1 may be controlled in response to a write enable signal /WEN activated to write data in the bank in the write mode.

Figure 6:
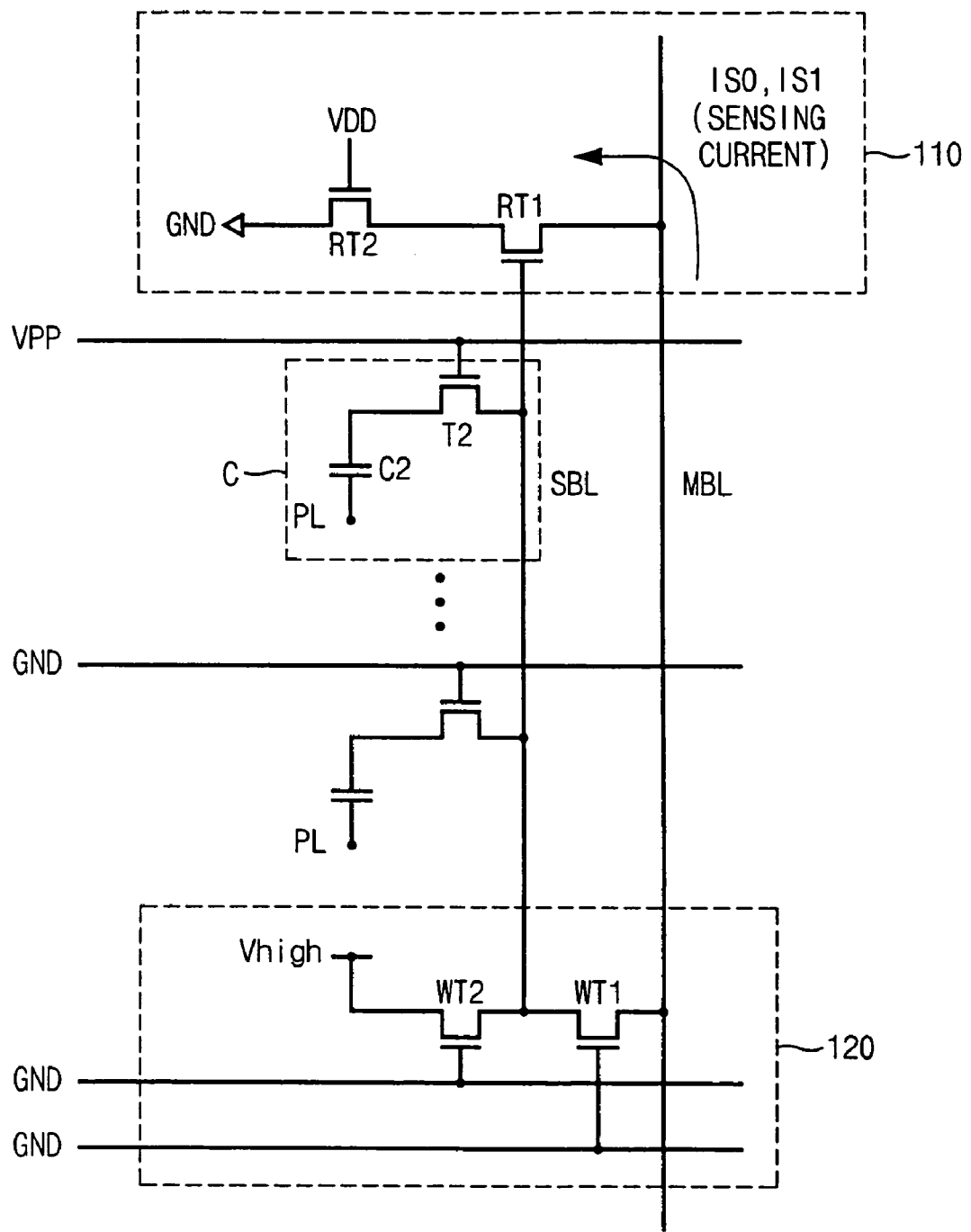
FIG. 6 is a diagram illustrating a sensing operation of FIG. 5 consistent with the present invention.

FIG. 6 is a diagram illustrating the sensing operation in the sub-cell array SCA of FIG. 5.

In a sensing mode, write enable signals WEN0, WEN1 are at a ground GND voltage level so that NMOS transistors WT1, WT2 are kept inactivated. As a result, restore/write adjusting unit 120 is not operated in the sensing mode.

In the sensing mode, read enable signal REN is at a power voltage VDD level to activate NMOS transistor RT2. A source of NMOS transistor RT1 receives ground voltage GND so that sensing currents IS0, IS1 received from main bit line MBL flow in NMOS transistor RT1. As a result, values of sensing currents IS0, IS1 flowing in NMOS transistor RT1 are differentiated depending on the voltage level of sub bit line SBL.

A pumping voltage VPP is applied to word line WL of a selected cell C to turn on switching transistor T2. The cell data stored in capacitor C2 is transmitted to sub bit line SBL.

When the data "0" is stored in cell C, a voltage of sub bit line SBL becomes lower. As a result, sensing current IS0 is sensed when a current of the data "0" flows in NMOS transistor RT1.

When the data "1" is stored in cell C, a voltage of sub bit line SBL becomes higher. As a result, sensing current IS1 is sensed when a current of the data "1" flows in NMOS transistor RT1. Current value of sensing current IS1 being higher than that of sensing current IS0. Consistent with the present invention, the sensing voltage of main bit line MBL may be maintained at a constant voltage.

Figure 7:
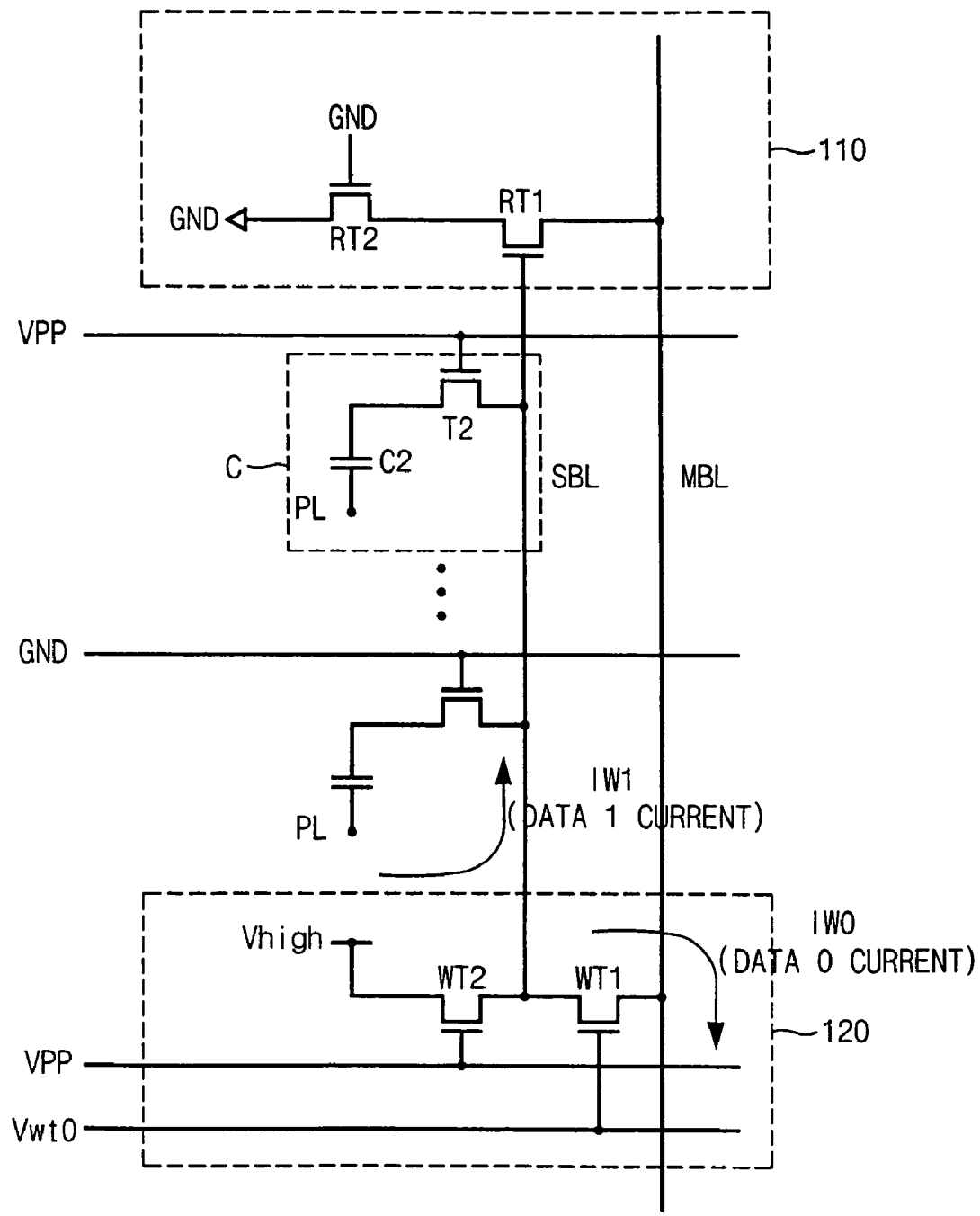
FIG. 7 is a diagram illustrating restore/write operations of FIG. 5 consistent with the present invention.

FIG. 7 is a diagram illustrating the restore/write operations in the sub-cell array SCA of FIG. 5.

After the sensing operation, read enable signal REN is at ground GND voltage level so that NMOS transistor RT2 is kept inactivated. In a restore/write mode, sensing adjusting unit 110 is not operated.

In the restore/write mode, write enable signal WEN1 is at a pumping voltage VPP level to activate NMOS transistor WT2. NMOS transistor WT2 receives high voltage Vhigh so that a data "1" current IW1 flows in sub bit line SBL. As a result, the data "1" is stored in corresponding cell C.

Write enable signal WEN0 is at a write voltage Vwt0. As a result, a data "0" current IW0 flows in main bit line MBL through NMOS transistor WT1.

Pumping voltage VPP is applied to word line WL of selected cell C to turn on switching transistor T2. As a result, the cell data can be stored in capacitor C2 depending on a voltage applied to sub bit line SBL.

When the data "0" is written in cell C, the voltage of main bit line MBL becomes a data "0" write voltage V0. Write enable signal WEN0 is at a write voltage Vwt0 level. Current IW0 flows in MBL depending on a level difference between data "0" write voltage V0 and high voltage Vhigh. That is, NMOS transistor WT1 is turned on so that data "0" current IW0 flows in main bit line MBL.

When the data "1" is written in cell C, the voltage of main bit line MBL becomes a data "1" write voltage V1. Write enable signal WEN0 is at write voltage Vwt0 level. As a result, data "0" current IW0 does not flow in MBL depending on a level difference between data "1" write voltage V1 and high voltage Vhigh.

The data "0" write voltage V0 and the data "1" write voltage V1 received from main bit line MBL are values obtained by feeding-back the corresponding voltages to data values after the operation of sense amplifier 300 in main bit line MBL. A voltage difference between data "1" write voltage V1 and data "0" write voltage V0 is defined by dV01. The voltage dV01 is defined by a voltage value to form a current difference between data "1" current IW1 and data "0" current IW0.

When data "0" current IW0 does not flow in main bit line MBL, a value of data "1" current IW1 is larger than that of data "0" current IW0. As a result, a voltage level of sub bit line SBL rises to high voltage Vhigh level. The data "1" is restored and written in cell C depending on high voltage Vhigh applied to sub bit line SBL.

When data "0" current IW0 flows in main bit line MBL, the value of data "0" current IW0 is larger than that of data "1" current IW1. The voltage level of sub bit line SBL remains at a low voltage Vlow. The data "0" is restored or written in cell C depending on low voltage Vlow applied to sub bit line SBL.

In one embodiment, the data are written not by pull-up/pull-down operations but by a voltage level adjusting method. As a result, the swing of the voltage of main bit line MBL is reduced in the write mode to reduce power consumption in the write mode.

Figure 8:
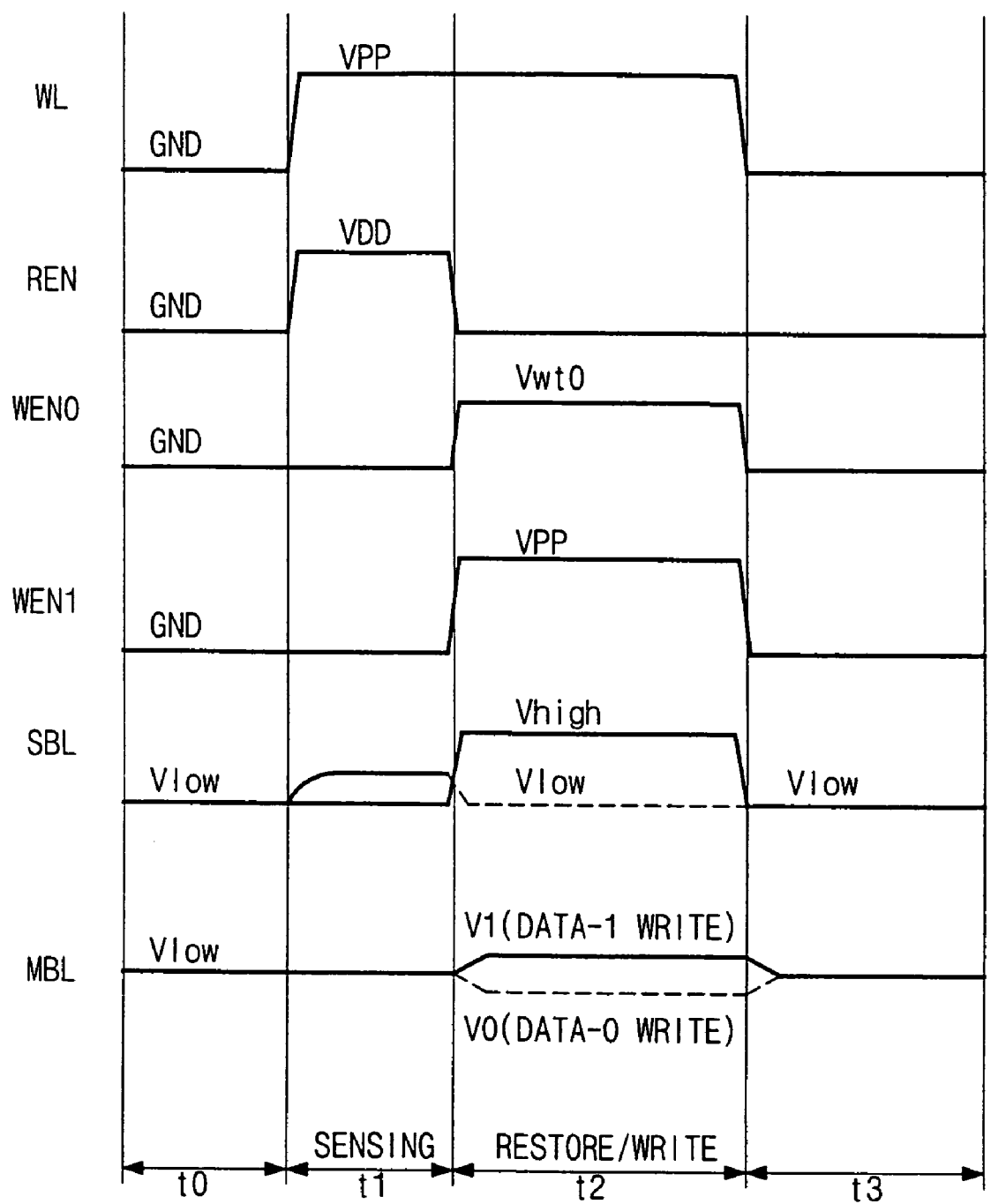
FIG. 8 is a timing diagram illustrating an operation of a semiconductor memory device consistent with the present invention.

FIG. 8 is a timing diagram illustrating an operation of a semiconductor memory device according to another embodiment consistent with the present invention.

In a precharge period t0, word line WL, read enable signal REN and write enable signals WEN0, WEN1 are maintained at ground voltage GND level. Sub bit line SBL and the main bit line MBL remain at the low voltage Vlow level.

In a sensing period t1, the corresponding word line WL transits into the pumping voltage VPP level for sensing data stored in cell C. Read enable signal REN transits to power voltage VDD level to turn on NMOS transistor RT2 of sensing adjusting unit 110.

Write enable signals WEN0, WEN1 are maintained at ground voltage GND level so that restoring/writing adjusting unit 120 is not operated. As a result, the data are read by a value of the current flowing in NMOS transistor RT1 may be differentiated depending on the voltage of sub bit line SBL.

In a restore/write period t2, the word line WL is maintained at the pumping voltage VPP level. After the sensing operation, the read enable signal REN transits to the ground voltage GND level so that the sensing adjusting unit 110 is not operated.

In period t2, write enable signal WEN0 transits to write voltage Vwt0 level. Write enable signal WEN1 transits to pumping voltage VPP level so as to transit data "1" current IW1 into sub bit line SBL. Write enable signal WEN0 transits to write voltage Vwt0 so as to flow data "0" current IW0 toward main bit line depending on the voltage of main bit line MBL.

When the data "1" is written in cell C, the voltage of main bit line MBL becomes the data "1" write voltage V1. The data "0" current IW0 does not flow in main bit line MBL so that the value of data "1" current IW1 is larger than that of data "0" current IW0. The voltage level of sub bit line SBL rises to the high voltage Vhigh level. As a result, the data "1" is restored or written in cell C depending on the high voltage Vhigh applied to sub bit line SBL.

When the data "0" is written in cell C, the voltage of main bit line MBL becomes data "0" write voltage V0. Data "0" current IW0 flows into main bit line MBL so that the value of data "0" current IW0 is larger than that of data "1" current IW1. The voltage level of sub bit line SBL remains at the low voltage Vlow level. As a result, the data "0" is restored or written in cell C depending on the low voltage Vlow applied to sub bit line SBL.

In a precharge period t3, word line WL, read enable signal REN and write enable signals WEN0, WEN1 are maintained at ground voltage GND level. Sub bit line SBL and main bit line MBL maintain the low voltage Vlow level.

Figure 9:
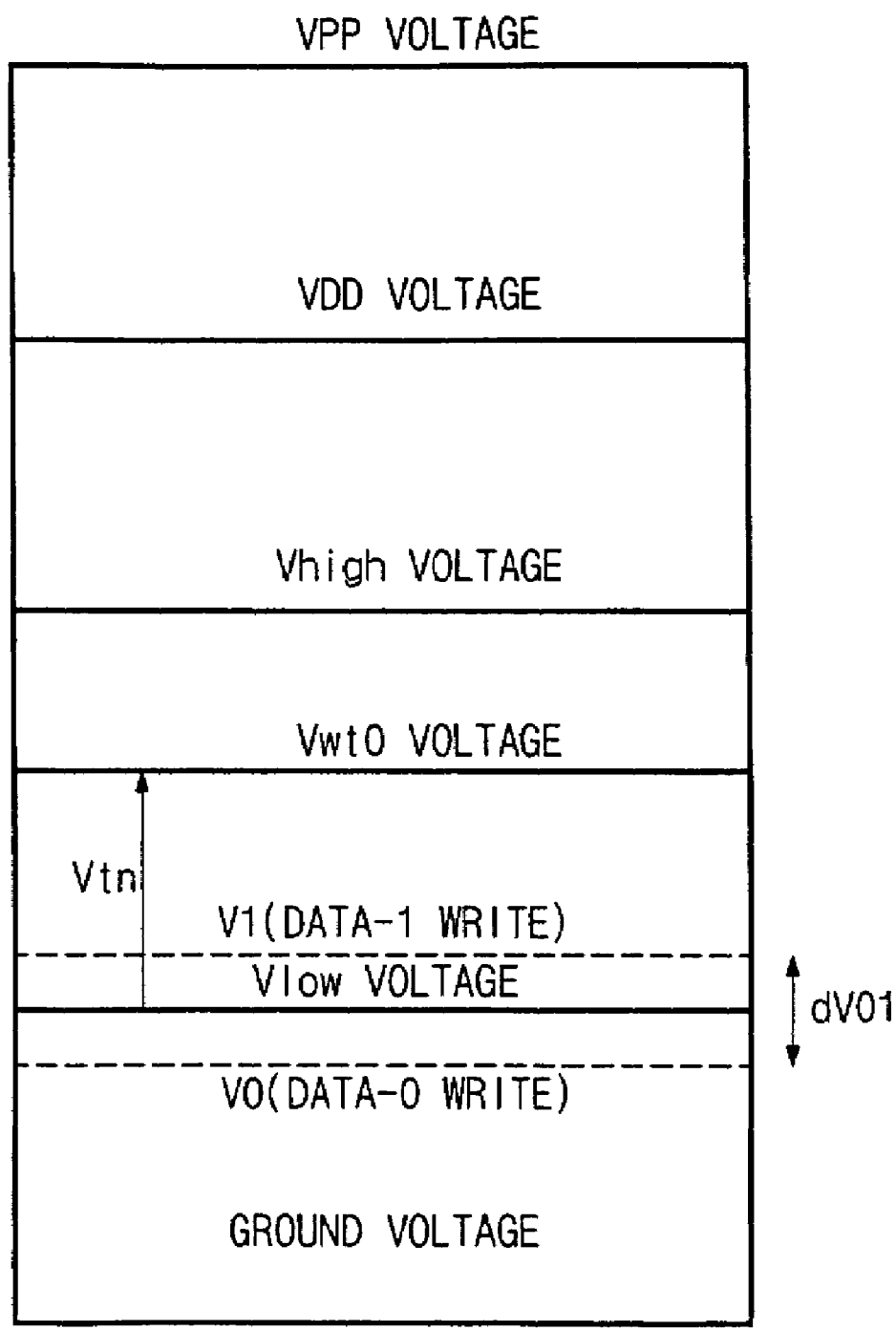
FIG. 9 is a diagram illustrating a relation of an operating voltage consistent with the present invention.

FIG. 9 is a diagram illustrating the relation of the operating voltage according to one embodiment consistent with the present invention.

Data "0" write voltage V0 for writing the data "0" in cell C has a level higher than that of ground voltage GND. The low voltage Vlow has a level higher than that of data "0" write voltage V0. Data "1" write voltage V1 for writing the data "1" in cell C has a higher level than that of the low voltage Vlow.

A voltage difference between data "1" write voltage V1 and data "0" write voltage V0 is defined by dV01. Data "1" write voltage V1 and data "0" write voltage V0 have the same absolute value based on the low voltage Vlow.

Write voltage Vwt0 has a level higher than that of data "1" write voltage V1. Write voltage Vwt0 has a value larger than the low voltage Vlow by a threshold voltage Vtn of NMOS transistor WT1 to turn on NMOS transistor WT1.

The high voltage Vhigh has a level higher than that of write voltage Vwt0. Power voltage VDD has a level higher than that of the high voltage Vhigh. Pumping voltage VPP has a level higher than that of power voltage VDD.

Figure 10:
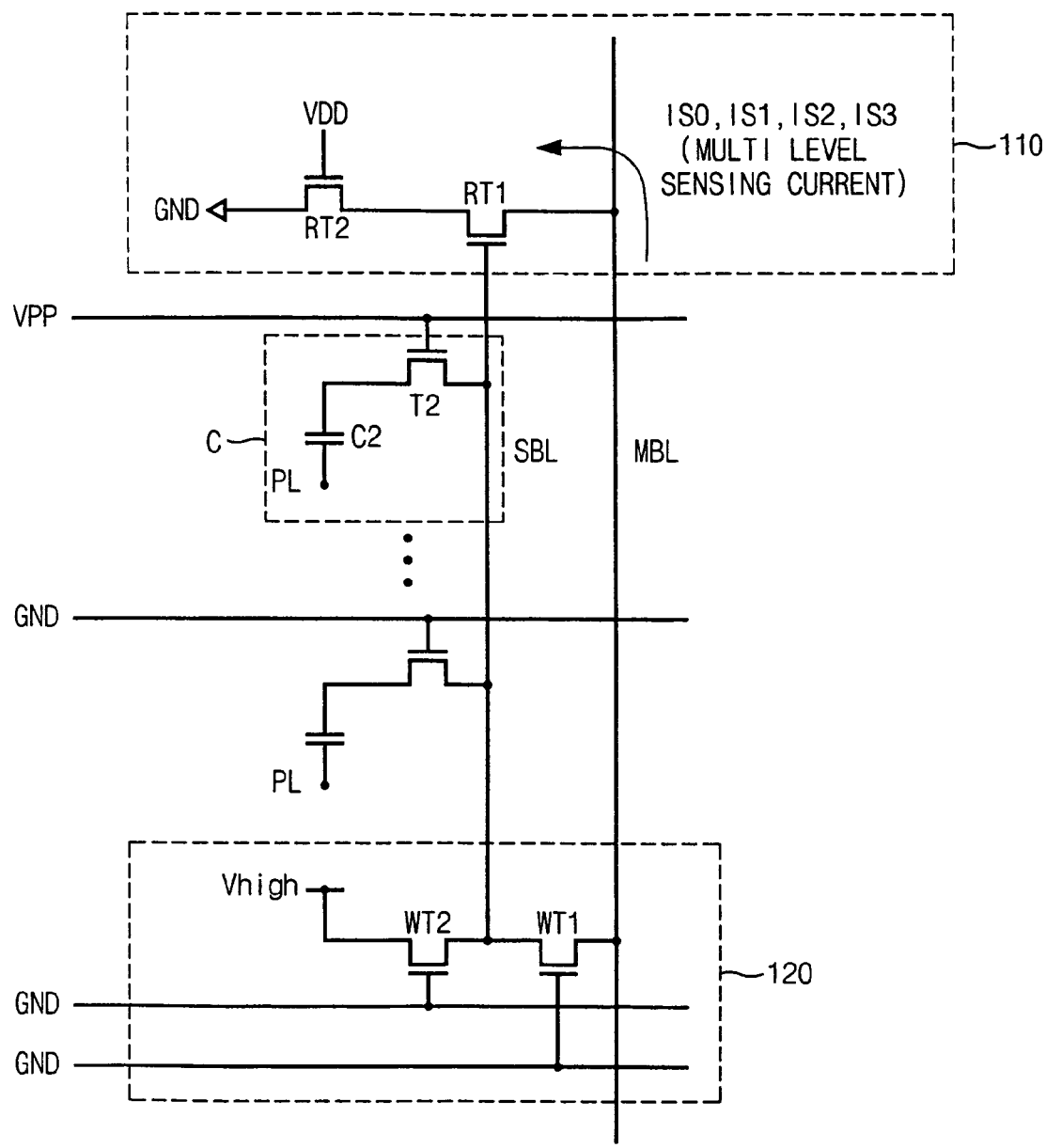
FIG. 10 is a diagram illustrating a semiconductor memory device consistent with the present invention

FIG. 10 is a diagram illustrating the multi data sensing operation in the sub-cell array SCA of FIG. 5.

In the sensing mode, the write enable signals WEN0, WEN1 are at the ground GND voltage level so that the NMOS transistors WT1, WT2 are kept inactivated. As a result, the restore/write adjusting unit 120 is not operated in the sensing mode.

In the sensing mode, read enable signal REN is at power voltage VDD level to activate NMOS transistor RT2. A source of NMOS transistor RT1 receives ground voltage GND so that a plurality of sensing currents IS0~IS3 received from main bit line MBL flow into NMOS transistor RT1. As a result, values of the sensing currents IS0~IS3 flowing into the NMOS transistors RT1 are differentiated depending on the voltage level of sub bit line SBL.

Although the four sensing current levels IS0~IS3 are shown in one embodiment, the current levels are not limited herein since the sensing current levels can be set at n levels.

Pumping voltage VPP is applied to word line WL of selected cell C to turn on switching transistor T2. The cell data stored in capacitor C2 is transmitted to sub bit line SBL.

When data "00" is stored in cell C, the voltage of sub bit line SBL becomes the lowest. As a result, the sensing current IS0 is sensed when a current of the data "00" flows into NMOS transistor RT1.

When data "01" is stored in cell C, the voltage of sub bit line SBL becomes higher than that corresponding to the data "00". As a result, sensing current IS1 is sensed when a current of the data "01" flows into NMOS transistor RT1.

When data "10" is stored in cell C, the voltage of sub bit line SBL becomes higher than that corresponding to the data "01". As a result, sensing current IS2 is sensed when a current of the data "10" flows into NMOS transistor RT1.

When data "11" is stored in cell C, the voltage of sub bit line SBL becomes higher than that corresponding to the data "10". As a result, sensing current IS3 is sensed when a current of the data "11" flows into NMOS transistor RT1. The values of the sensing currents are set to be IS3>IS2>IS1>IS0. Consistent with the present invention, the sensing voltage of main bit line MBL may be kept constant.

Figure 11:
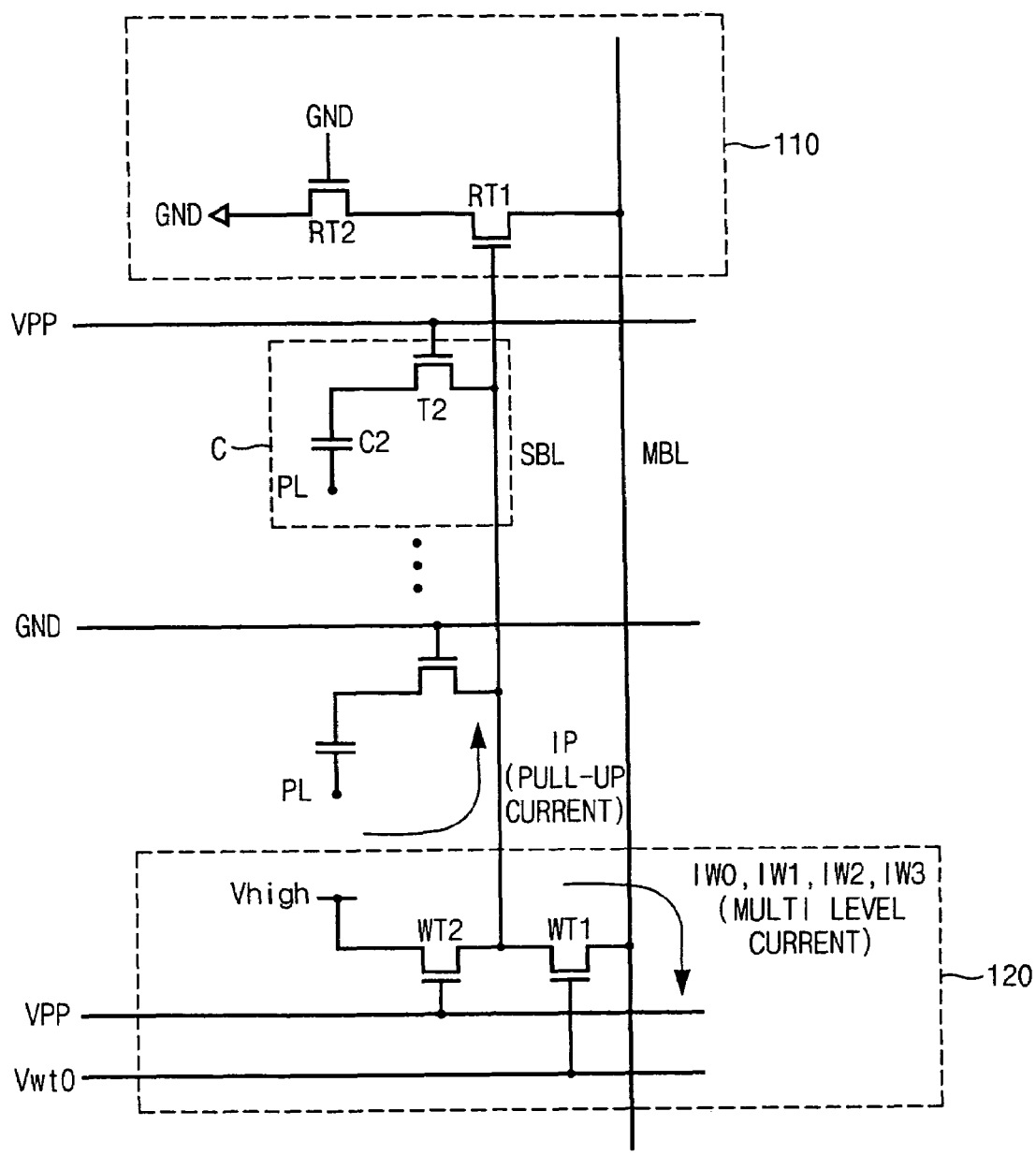
FIG. 11 is a diagram illustrating multi data restore/write operations of FIG. 10 consistent with the present invention.

FIG. 11 is a diagram illustrating the multi data restore/write operations in sub-cell array SCA of FIG. 10. The "multi-data" refers to data having a multi level. In other words, the "multi-data" means not storing several data in a cell simultaneously but storing or reading data having several different levels in the cell.

After the multi level sensing operation, read enable signal REN is at ground GND voltage level so that NMOS transistor RT2 is kept inactivated. In the restore/write mode, sensing adjusting unit 110 is not operated.

In the multi level restore/write mode, write enable signal WEN1 is at a pumping voltage VPP level to activate NMOS transistor WT2. NMOS transistor WT2 receives the high voltage Vhigh so that a pull-up current IP flows into sub bit line SBL.

Write enable signal WEN0 is at write voltage Vwt0. As a result, a plurality of multi level currents IW0~IW3 flow into main bit line MBL through NMOS transistor WT1.

Pumping voltage VPP is applied to word line WL of selected cell C to turn on switching transistor T2. As a result, the cell data can be stored in capacitor C2 depending on a voltage applied to sub bit line SBL.

When the data "00" is written in cell C, the voltage of main bit line MBL becomes a data "00" write voltage V00. Write enable signal WEN0 is at the write voltage Vwt0 level. The current IW0 flows into MBL depending on a level difference between the data "00" write voltage V00 and the high voltage Vhigh. That is, NMOS transistor WT1 is turned on so that data "00" current IW0 flows into main bit line MBL.

When the data "01" is written in cell C, the voltage of main bit line MBL becomes a data "01", write voltage V01. Write enable signal WEN0 is at write voltage Vwt0 level. As a result, a current IW1 flows into MBL depending on a level difference between the data "01" write voltage V01 and the high voltage Vhigh. That is, NMOS transistor WT1 is turned on to flow the data "01" current IW1 into main bit line MBL.

When the data "10" is written in cell C, the voltage of main bit line MBL becomes a data "10" write voltage V10. Write enable signal WEN0 is at write voltage Vwt0 level. As a result, a current IW2 flows into MBL depending on a level difference between the data "10" write voltage V10 and the high voltage Vhigh. That is, NMOS transistor WT1 is turned on to flow the data "10" current IW2 into main bit line MBL.

When the data "11" is written in cell C, the voltage of main bit line MBL becomes a data "11" write voltage V11. Write enable signal WEN0 is at write voltage Vwt0 level. As a result, a current IW3 flows into main bit line MBL depending on a level difference between the data "11" write voltage V11 and the high voltage Vhigh.

The plurality of write voltages V00~V11 received from main bit line MBL are values obtained by feeding-back the corresponding voltages to data values after the operation of sense amplifier 300 in main bit line MBL. The current values flowing into main bit line MBL are set to be IW0>IW1>IW2>IW3.

When the data "00" current IW0 flows into main bit line MBL, the data "00" is restored or written. When the data "01" current IW1 flows into main bit line MBL, the data "01" is restored or written. When the data "10" current IW2 flows into main bit line MBL, the data "10" is restored or written. When the data "11" current IW3 flows into main bit line MBL, the data "11" is restored or written in cell C.

In one embodiment, the data are written not by pull-up/pull-down operations but by a voltage level adjusting method. As a result, the swing of the voltage of main bit line is reduced in the write mode to reduce power consumption.

Figure 12:
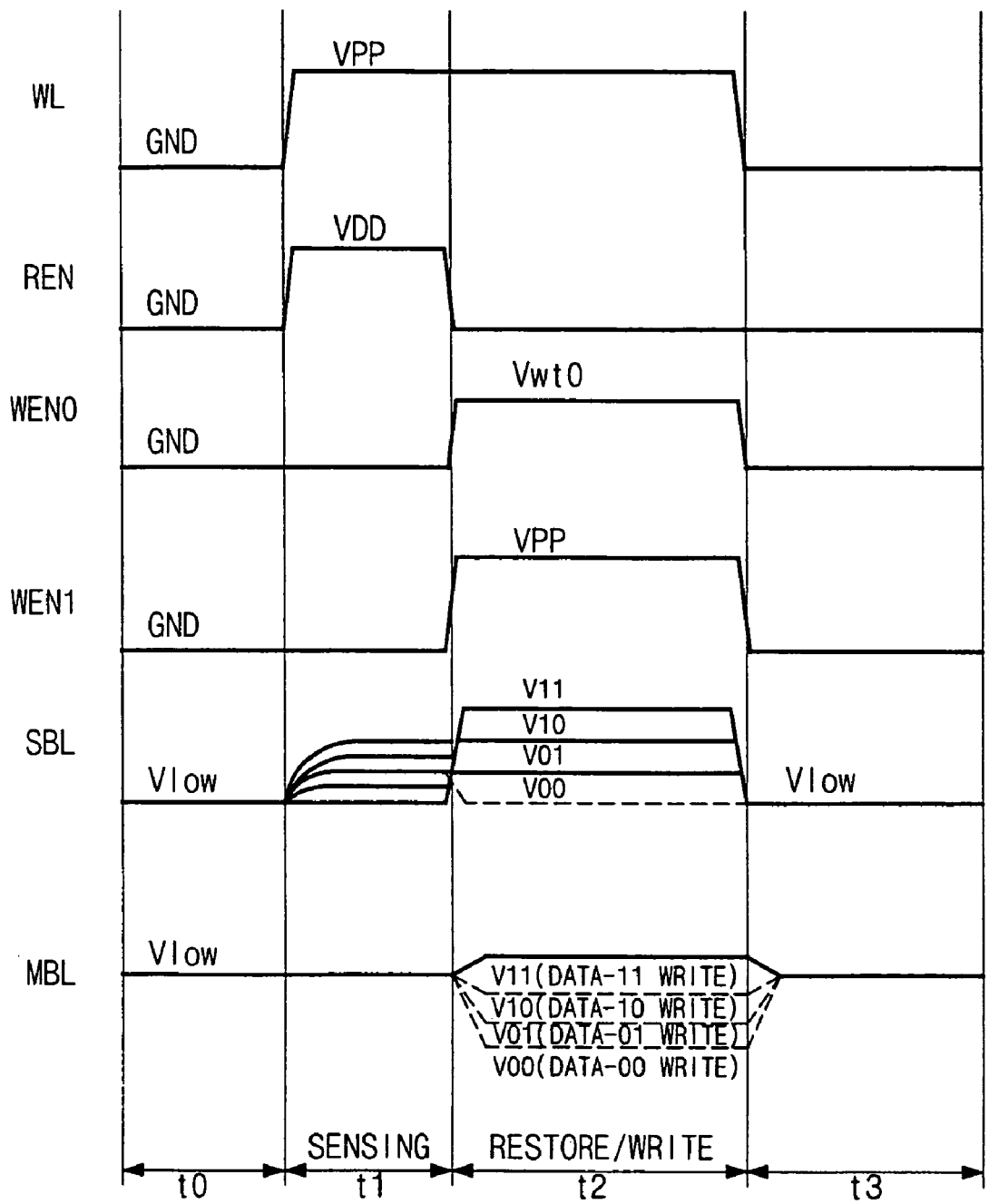
FIG. 12 is a timing diagram illustrating an operation of a semiconductor memory device consistent with the present invention.

FIG. 12 is a timing diagram illustrating the operation of the semiconductor memory device according to another embodiment.

In a precharge period t0, word line WL, read enable signal REN and write enable signals WEN0, WEN1 are maintained at ground voltage GND level. Sub bit line SBL and main bit line MBL maintain the low voltage Vlow level.

In a sensing period t1, the corresponding word line WL transmits into the pumping voltage VPP level for sensing data stored in the cell C. The read enable signal REN transits to the power voltage VDD level to turn on the NMOS transistor RT2 of the sensing adjusting unit 110.

The write enable signals WEN0, WEN1 are maintained at the ground voltage GND level so that the restoring/writing adjusting unit 120 is not operated. As a result, a plurality of current values flowing in the NMOS transistor RT1 are sensed depending on the voltage of the sub bit line SBL to read multi data.

In a restore/write period t2, the word line WL is maintained at the pumping voltage VPP level. After the sensing operation, the read enable signal REN transits to the ground voltage GND level so that the sensing adjusting unit 110 is not operated.

In the period t2, the write enable signal WEN0 transits to the write voltage Vwt0 level. The write enable signal WEN1 transits to the pumping voltage VPP level so as to transmit the pull-up current IP into the sub bit line SBL. The write enable signal WEN0 transits to the write voltage Vwt0 so as to flow the plurality of currents IW0~IW3 toward the main bit line MBL depending on the voltage of the main bit line MBL.

When the write voltage V00 flows in the main bit line MBL, the data "00" is restored or written in the cell C. When the write voltage V01 flows in the main bit line MBL, the data "01" is restored or written in the cell C. When the write voltage V10 flows in the main bit line MBL, the data "10" is restored or written in the cell C. When the write voltage V11 flows in the main bit line MBL, the data "11" is restored or written in the cell C.

In a precharge period t3, the word line WL, the read enable signal REN and the write enable signals WEN0, WEN1 are maintained at the ground voltage GND level. The sub bit line SBL and the main bit line MBL maintain the low voltage Vlow level.

Figure 13:
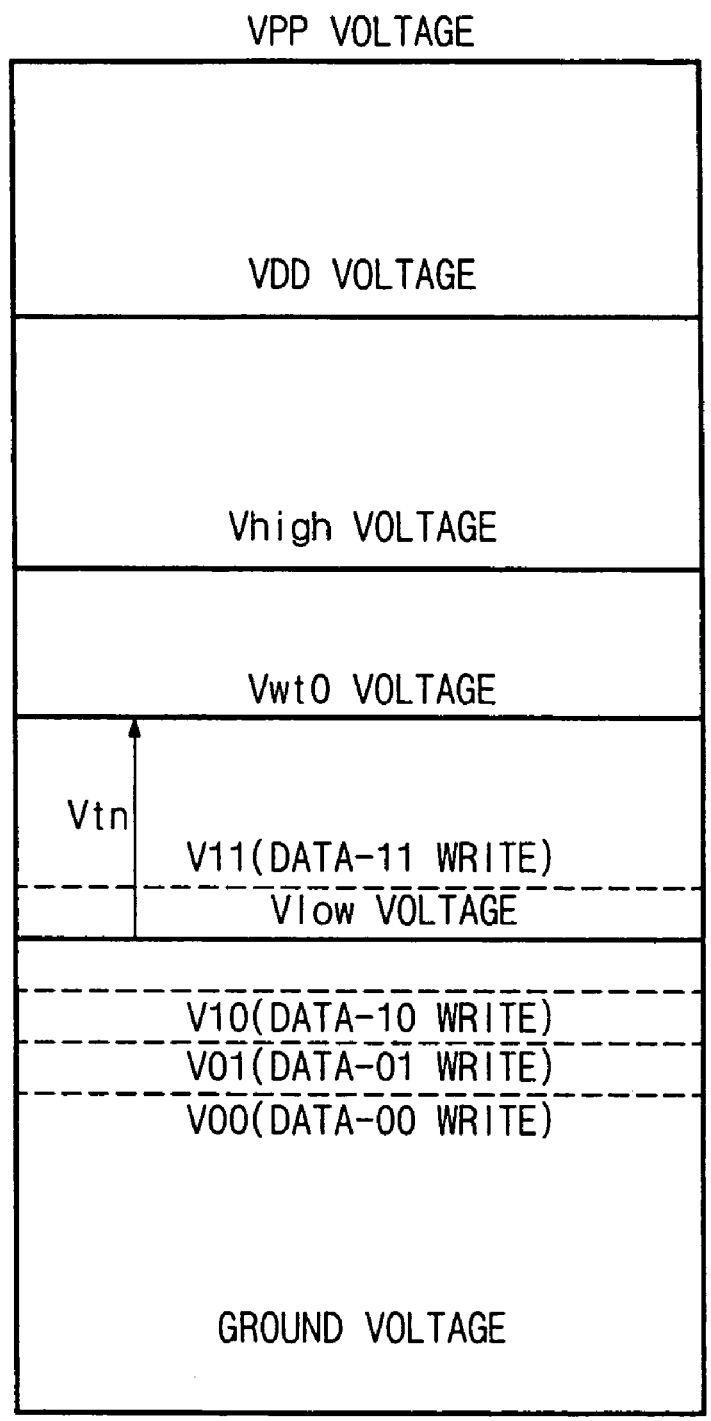
FIG. 13 is a diagram illustrating a relation of an operating voltage consistent with the present invention.

FIG. 13 is a diagram illustrating the relation of the operating voltage according to one embodiment.

The data "00" write voltage V00 for writing the data "00" in the cell C has a level higher than that of the ground voltage GND. The data "01" write voltage V01 for writing the data "01" in the cell C has a level higher than that of the write voltage V00. The data "10" write voltage V10 for writing the data "10" in the cell C has a level higher than that of the write voltage V01. The low voltage Vlow has a level higher than that of the data "10" write voltage V10. The data "11" write voltage V11 for writing the data "11" in the cell C has a level higher than that of the low voltage Vlow.

The write voltage Vwt0 has a level higher than that of the data "11" write voltage V11. The write voltage Vwt0 has a value larger than the low voltage Vlow by a threshold voltage Vtn of the NMOS transistor WT1 to turn on the NMOS transistor WT1.

The high voltage Vhigh has a level higher than that of the write voltage Vwt0. The power voltage VDD has a level higher than that of the high voltage Vhigh. The pumping voltage VPP has a level higher than that of the power voltage VDD.

Figure 14:
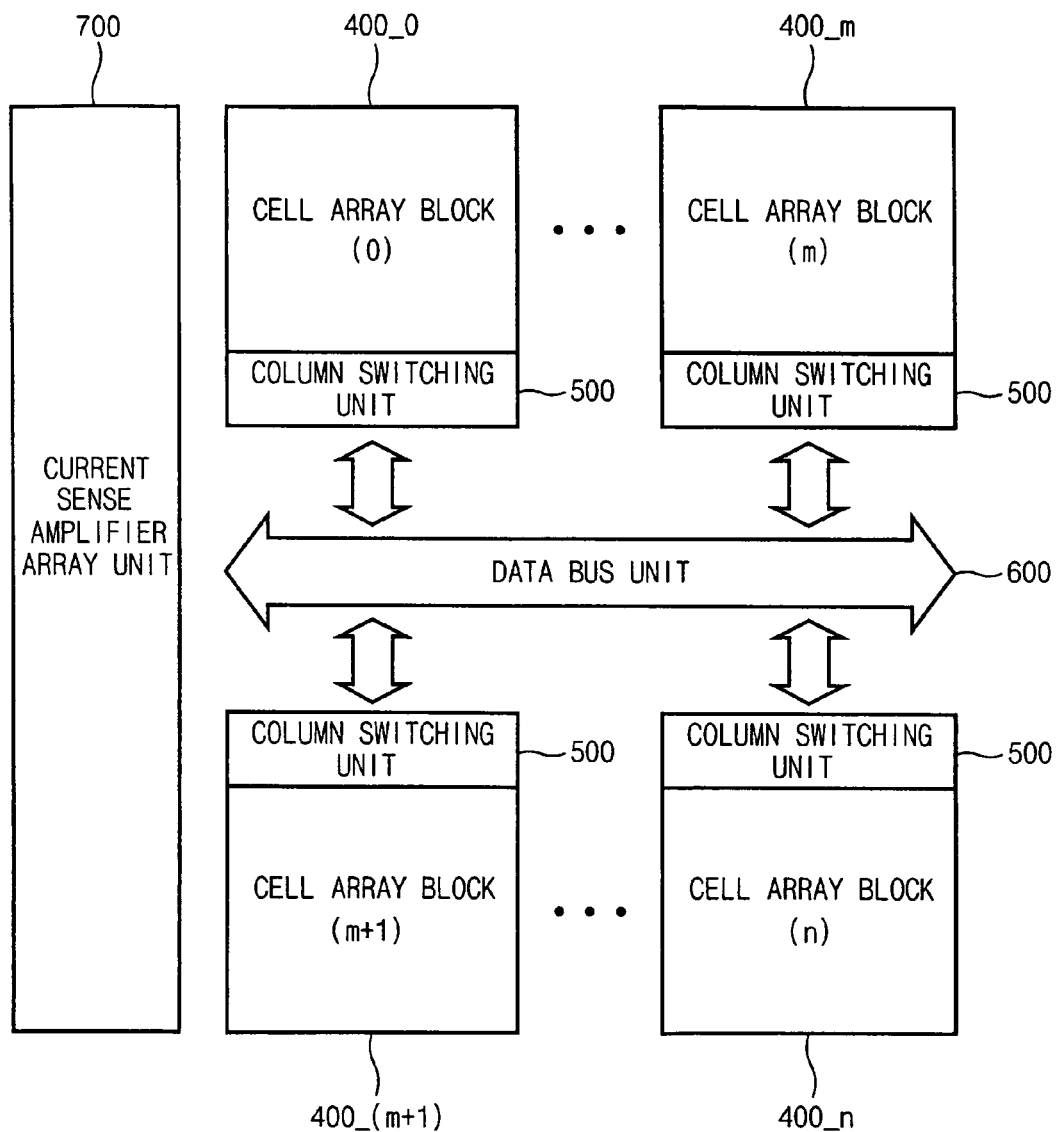
FIG. 14 is a diagram illustrating a semiconductor memory device consistent with the present invention.

FIG. 14 is a diagram illustrating a semiconductor memory device according to one embodiment.

The semiconductor memory device of FIG. 14 comprises a plurality of cell array blocks 400_0~400_n, a column switching unit 500, a data bus unit 600 and a current sense amplifier array unit 700.

Cell array blocks 400_0~400_n includes top cell array blocks 400_0~400_m and bottom cell array blocks 400_m+1~400_n which are symmetrically disposed up and down based on data bus 600. Each of the cell array blocks 400_0~400_n is connected to the data bus unit 600 through column switching unit 500.

Column switching unit 500 has a terminal connected to main bit line MBL and the other terminal connected to data bus unit 600. Data bus unit 600 is shared by cell array blocks 400_0~400_n.

Current sense amplifier array unit 700 connected to data bus unit 600 is configured to sense and amplify cell data received from cell array blocks 400_0~400_n. Current sense amplifier array unit 700 senses a current flowing in main bit line MBL to distinguish data "0" from data "1".

Figure 15:
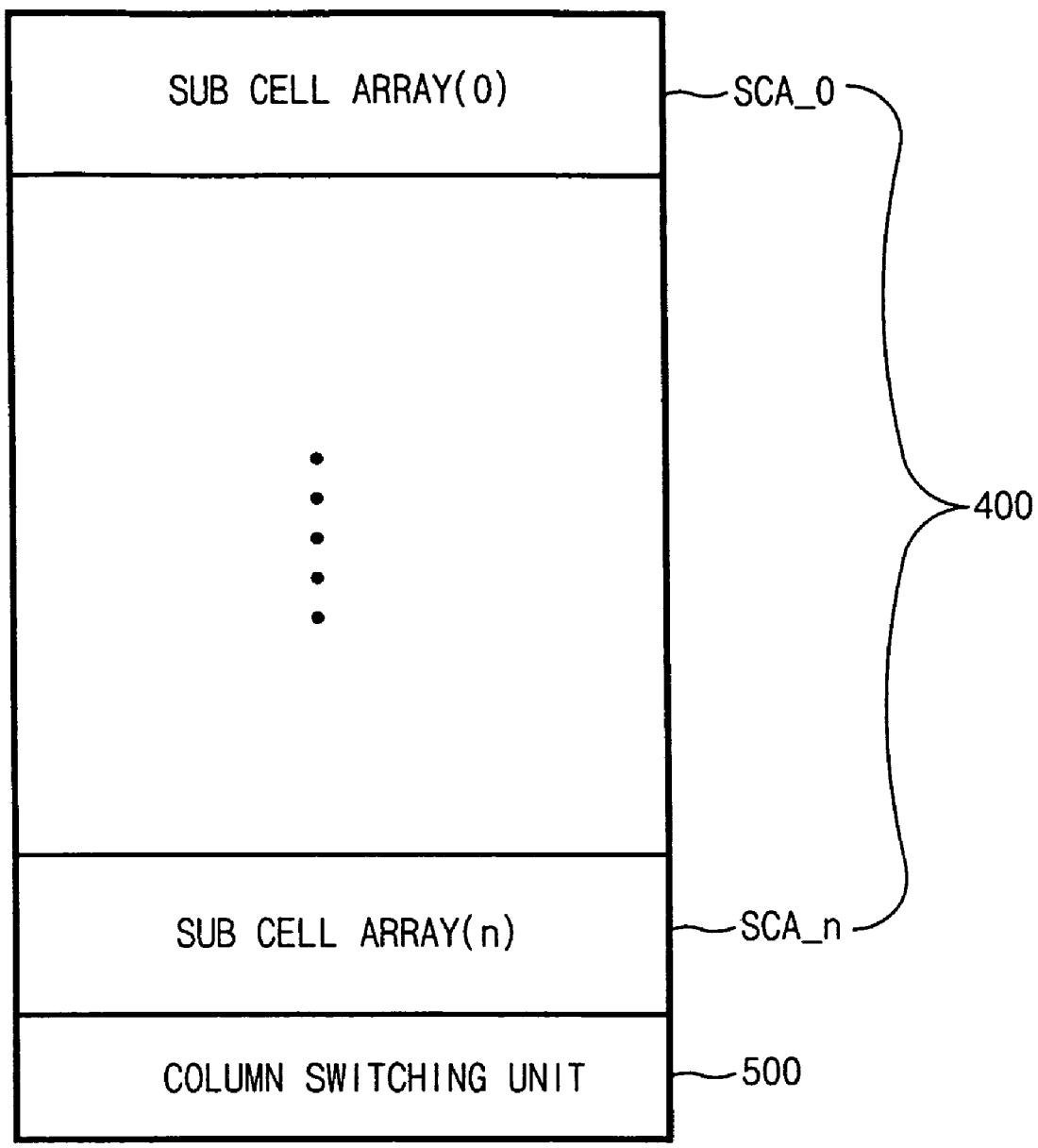
FIG. 15 is a diagram illustrating a cell array block of FIG. 14 consistent with the present invention.

FIG. 15 is a diagram illustrating cell array block 400_0~400_n of FIG. 14.

Each of cell array blocks 400_0~400_n includes a plurality of sub-cell arrays SCA_0~SCA_n. Each of cell array blocks 400_0~400_n includes main bit line MBL and sub bit line SBL.

Sub bit line SBL is positioned in each of sub-cell arrays SCA_0~SCA_n, and main bit line MBL is shared in each of sub-cell arrays SCA_0~SCA_n. Main bit line MBL of each of sub-cell arrays SCA_0~SCA_n is connected to current sense amplifier array unit 700 through column switching unit 500 and data bus unit 600.

Main bit line MBL in each of the sub-cell arrays SCA_0~SCA_n corresponds one-to-one or one-to-more to sub bit line SBL. A sensing voltage of main bit line MBL is induced depending on cell data of sub bit line SBL.

Sub-cell array SCA has a hierarchical bit line structure including a main bit line MBL and a sub bit line SBL. Sub-cell array SCA adjusts the current amount transmitted into the main bit line MBL depending on the sensing voltage of sub bit line SBL to receive the cell data to induce the sensing voltage of main bit line MBL.

Figure 16:
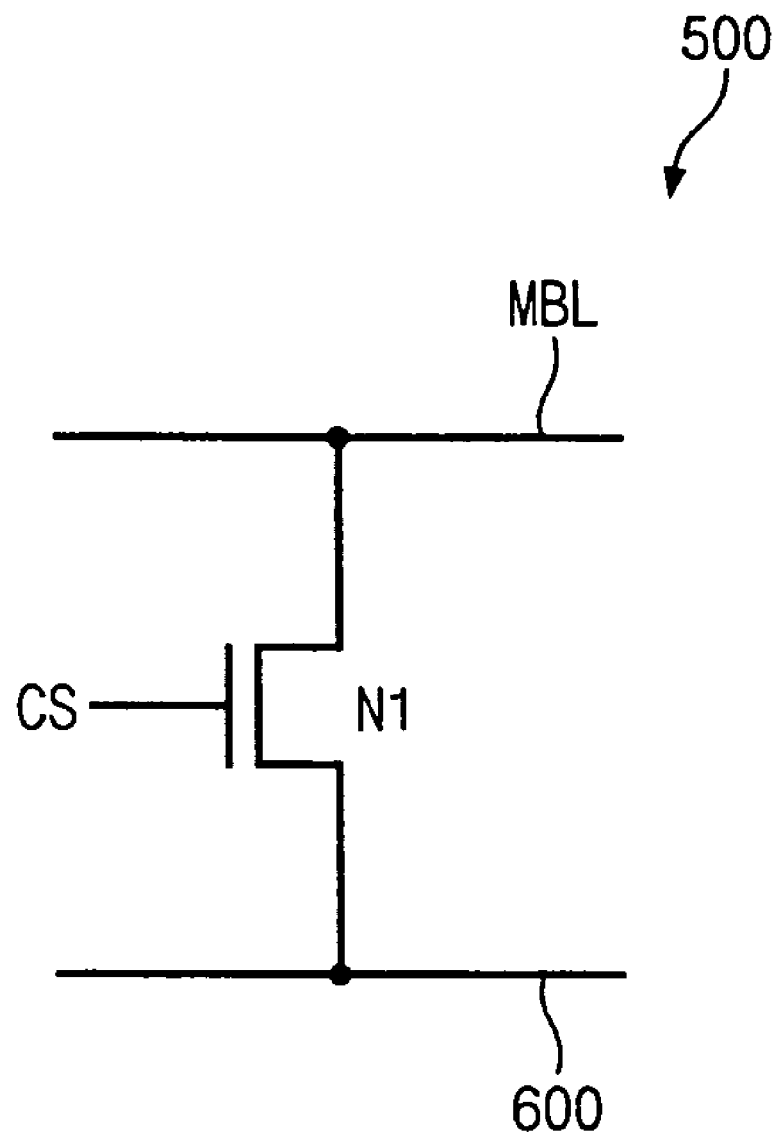
FIG. 16 is a circuit diagram illustrating a column switching unit of FIG. 15 consistent with the present invention.

FIG. 16 is a circuit diagram illustrating the column switching unit 500 of FIG. 15.

Column switching unit 500 includes a NMOS transistor N1. The NMOS transistor N1, connected between the data bus unit 600 and main bit line MBL of the sub-cell array SCA, has a gate to receive a column selecting signal CS.

Figure 17:
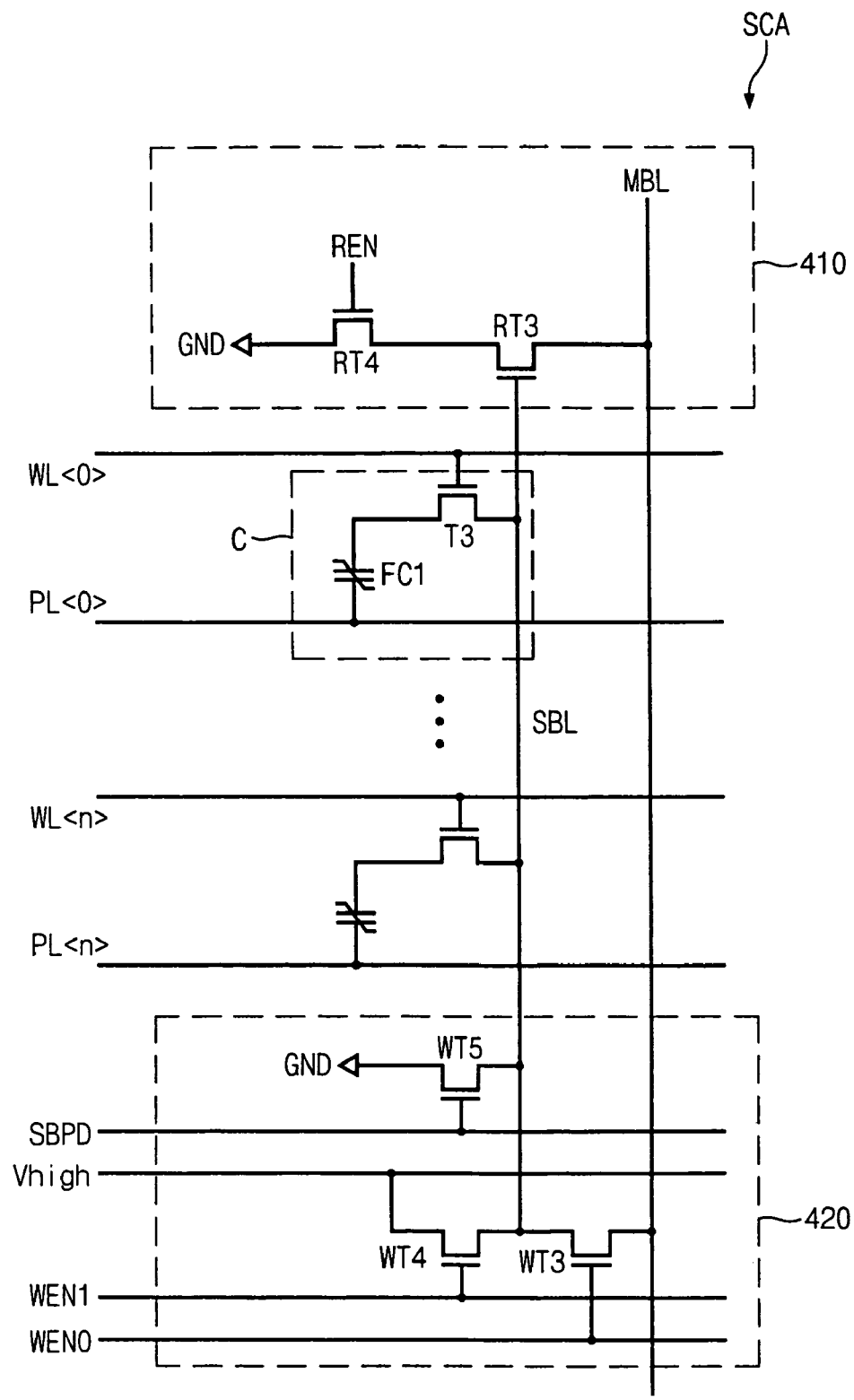
FIG. 17 is a circuit diagram illustrating a sub-cell array of FIG. 15 consistent with the present invention.

FIG. 17 is a circuit diagram illustrating the sub-cell array SCA of FIG. 15.

Sub-cell array SCA comprises a sensing adjusting unit 410, which may be a cell data sensing unit, a plurality of unit cells C and a restore/write adjusting unit 420, which is a write control unit.

Sensing adjusting unit 410 includes switching elements RT3, RT4 connected serially. The switching elements RT3, RT4 include NMOS transistors. NMOS transistor RT3, which is a sensing unit, is connected between NMOS transistor RT4 and main bit line MBL, and has a gate connected to sub bit line SBL. NMOS transistor RT4, connected between a ground GND voltage terminal and NMOS transistor RT3, has a gate to receive a read enable signal REN. Read enable signal REN adjusts activation of a read current.

Each of the sub-cell arrays SCA(0)~SCA(n) has a plurality of memory cells C connected to the sub bit line SBL for storing data. A sub bit line SBL is connected to the plurality of unit cells C. Each of the unit cells C comprises a switching transistor T3 and a ferroelectric capacitor FC1 to have a 1T1C structure.

Switching transistor T3, connected between sub bit line SBL and ferroelectric capacitor FC1, performs a switching operation depending on a voltage of the word line WL to adjust the sensing voltage of the main bit line MBL. The ferroelectric capacitor FC1 is connected between the switching transistor T3 and a plate line PL. The sub bit line SBL has a terminal connected to the gate of the NMOS transistor RT3, and the other terminal connected to the restore/write adjusting unit 420.

The restore/write adjusting unit 420 includes switching elements WT3, WT4 connected serially, and a pull-down switching element WT5. The switching elements WT3, WT4 and the pull-down switching element WT5 include NMOS transistors. The NMOS transistor WT3, connected between the sub bit line SBL and the main bit line MBL, has a gate to receive a write enable signal WEN0.

The NMOS transistor WT4, which is a voltage supplying unit, is connected between a high voltage Vhigh terminal and the NMOS transistor WT3, and has a gate to receive a write enable signal WEN1. The pull-down switching element WT5, connected between the sub bit line SBL and the ground GND voltage terminal, has a gate to receive a sub bit line pull-down signal SBPD.

A high voltage Vhigh means a cell activating voltage for storing "high data" of the cell data. The high voltage Vhigh is generated by a high voltage generating unit to supply a high voltage to a bank including the unit cell C in a write mode. The write enable signals WEN0, WEN1 are controlled in response to a write enable signal /WEN activated to write data in the bank in the write mode.

Figure 18:
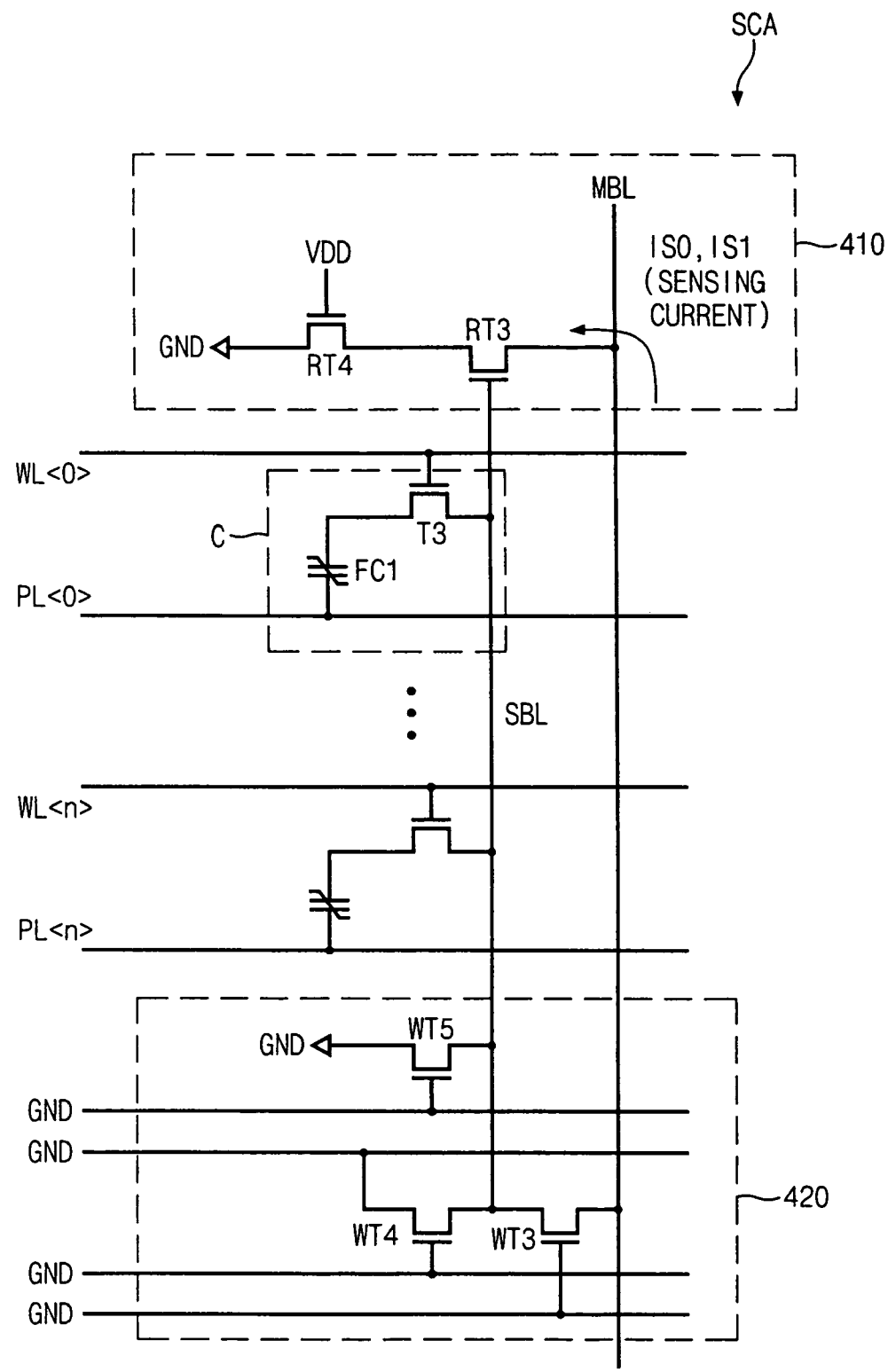
FIG. 18 is a diagram illustrating a sensing mode operation of FIG. 17 consistent with the present invention.

FIG. 18 is a diagram illustrating the sensing mode operation in the sub-cell array SCA of FIG. 17.

In a sensing mode, the write enable signals WEN0, WEN1 are at the ground GND voltage level so that the NMOS transistors WT3, WT4 are kept inactivated. The sub bit line pull-down signal SBPD is at the ground GND voltage level so that the NMOS transistor WT5 is kept off. As a result, the restore/write adjusting unit 420 is not operated in the sensing mode.

In the sensing mode, the read enable signal REN is at a power voltage VDD level to activate the NMOS transistor RT4. A source of the NMOS transistor RT3 receives the ground voltage GND so that sensing currents IS0, IS1 received from the main bit line MBL flow in the NMOS transistor RT3. As a result, values of the sensing currents IS0, IS1 flowing the NMOS transistors RT3 are differentiated depending on the voltage level of the sub bit line SBL.

A pumping voltage VPP is applied to the word line WL of the selected cell C to turn on the switching transistor T3. The cell data stored in the ferroelectric capacitor FC1 is transmitted to the sub bit line SBL.

When the data "0" is stored in the cell C, a voltage of the sub bit line SBL becomes lower. As a result, the sensing current IS0 is sensed when a current of the data "0" flows in the NMOS transistor RT3.

When the data "1" is stored in the cell C, a voltage of the sub bit line SBL becomes higher. As a result, the sensing current IS1 is sensed when a current of the data "1" flows in the NMOS transistor RT3. A current value of the sensing current IS1 is higher than that of the sensing current IS0. The sensing voltage of the main bit line MBL is supposed to be constant.

Figure 19:
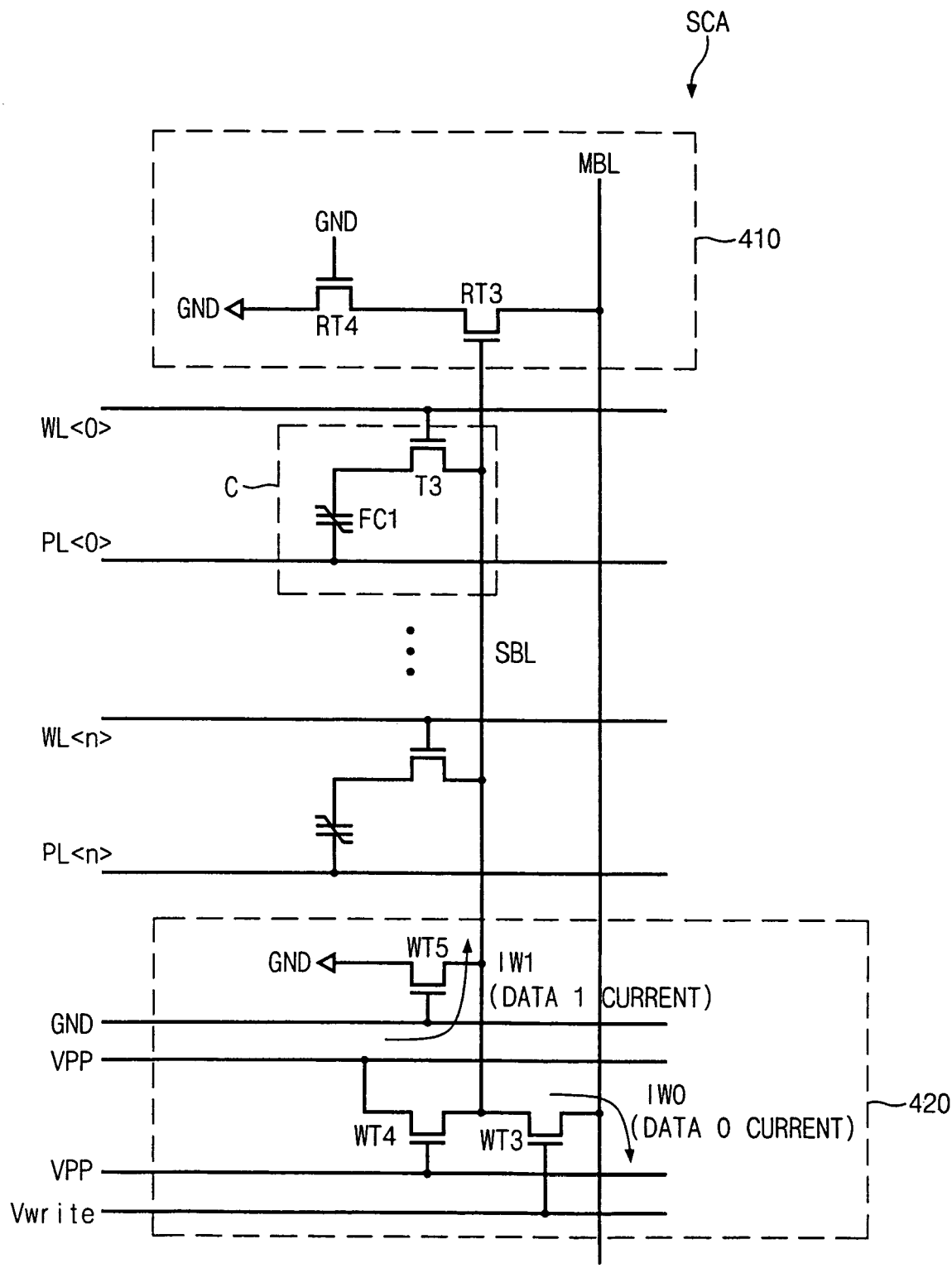
FIG. 19 is a diagram illustrating restore/write operations of FIG. 17 consistent with the present invention.

FIG. 19 is a diagram illustrating the restore/write operations in a sub-cell array SCA of FIG. 17.

After the sensing operation, the read enable signal REN is at the ground GND voltage level so that the NMOS transistor RT4 is kept inactivated. In a restore/write mode, the sensing adjusting unit 410 is not operated.

In the restore/write mode, the write enable signal WEN1 is at a pumping voltage VPP level to activate the NMOS transistor WT4. And high voltage Vhigh is at a pumping voltage VPP level. The NMOS transistor WT4 receives the high voltage Vhigh so that a data "1" current IW1 flows in the sub bit line SBL. As a result, the data "1" is stored in the corresponding cell.

The write enable signal WEN0 is at a write voltage Vwrite. As a result, a data "0" current IW0 flows in the main bit line MBL through the NMOS transistor WT3.

The pumping voltage VPP is applied to the word line WL of the selected cell C to turn on the switching transistor T3. As a result, the cell data can be stored in the ferroelectric capacitor FC1 depending on the voltage applied to the sub bit line SBL.

When the data "0" is written in the cell C, the voltage of the main bit line MBL becomes a data "0" write voltage V0. The write enable signal WEN0 is at a write voltage Vwrite level. The current IW0 flows in the main bit line MBL depending on a level difference between the data "0" write voltage V0 and the high voltage Vhigh. That is, the NMOS transistor WT3 is turned on so that the data "0" current IW0 flows in the main bit line MBL.

When the data "1" is written in the cell C, the voltage of the main bit line MBL becomes a data "1" write voltage V1. The write enable signal WEN0 is at the write voltage Vwrite level. As a result, the data "0" current IW0 does not flow in the MBL depending on a level difference between the data "1" write voltage V1 and the high voltage Vhigh.

The data "0" write voltage V0 and the data "1" write voltage V1 received from the main bit line MBL are values obtained by feeding-back the corresponding voltages to data values after the operation of the current sense amplifier array unit 700 in the main bit line MBL. A voltage difference between the data "1" write voltage V1 and the data "0" write voltage V0 is defined by dV01. The voltage dV01 is defined by a voltage value to form a current difference between the data "1" current IW1 and the data "0" current IW0.

When the data "0" current IW0 does not flow in the main bit line MBL, a value of the data "1" current IW1 is larger than that of the data "0" current IW0. As a result, a voltage level of the sub bit line SBL rises to the high voltage Vhigh level. The data "1" is restored and written in the cell C depending on the high voltage Vhigh applied to the sub bit line SBL.

When the data "0" current IW0 flows in the main bit line MBL, the value of the data "0" current IW0 is larger than that of the data "1" current IW1. The voltage level of the sub bit line SBL remains at a data bus voltage V_DB level. The data "0" is restored or written in the cell C depending on the data bus voltage V_DB applied to the sub bit line SBL.

In the embodiment, the data are written not by pull-up/pull-down operations but by a voltage level adjusting method. As a result, the swing of the voltage of the main bit line is reduced in the write mode to reduce power consumption.

Figure 20:
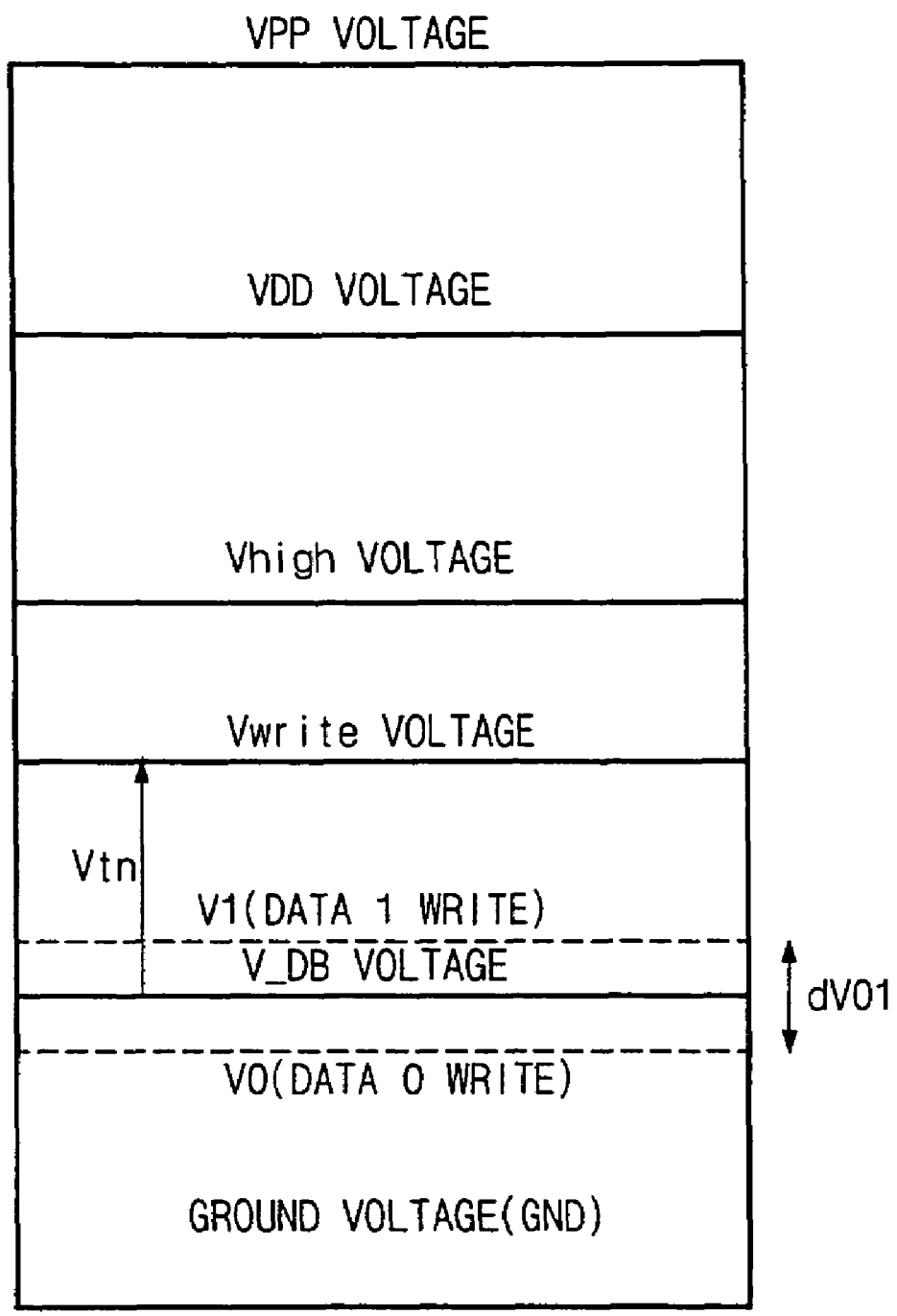
FIG. 20 is a diagram illustrating a relation of an operating voltage consistent with the present invention.

FIG. 20 is a diagram illustrating the relation of the operating voltage according to an embodiment of the present invention.

The data "0" write voltage V0 for writing the data "0" in the cell C has a level higher than that of the ground voltage GND. The data bus voltage V_DB has a level higher than that of the data "0" write voltage V0. The data "1" write voltage V1 for writing the data "1" in the cell C has a level higher than that of the data bus voltage V_DB.

A voltage difference between the data "1" write voltage V1 and the data "0" write voltage V0 is defined by dV01. The data "1" write voltage V1 and the data "0" write voltage V0 have the same absolute value based on the data bus voltage V_DB.

The write voltage Vwrite has a level higher than that of the data "1" write voltage V1. The write voltage Vwrite has a value larger than the data bus voltage V_DB by a threshold voltage Vtn of the NMOS transistor WT3 to turn on the NMOS transistor WT3.

The high voltage Vhigh has a level higher than that of the write voltage Vwrite. The power voltage VDD has a level higher than that of the high voltage Vhigh. The pumping voltage VPP has a level higher than that of the power voltage VDD.

Figure 21:
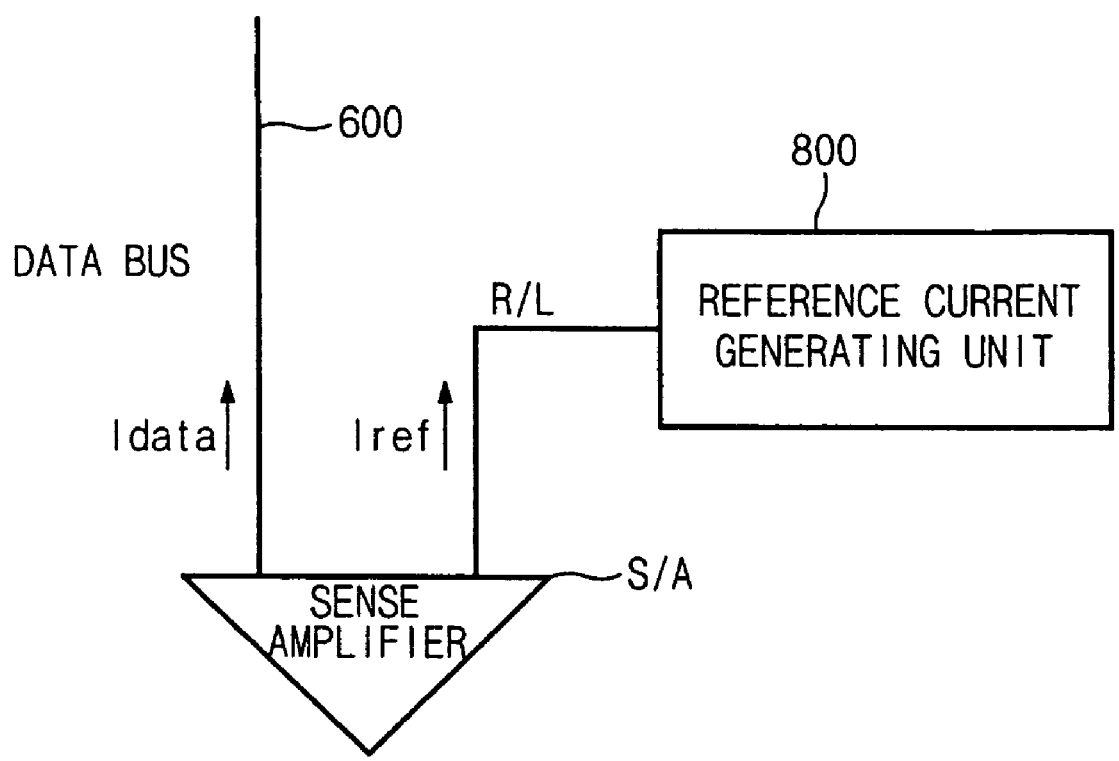
FIG. 21 is a diagram illustrating a current sense amplifier array unit of FIG. 14 consistent with the present invention.

FIG. 21 is a diagram illustrating the current sense amplifier array unit 700 of FIG. 14.

The current sense amplifier array unit 700 includes a sense amplifier S/A and a reference current generating unit 800.

The sense amplifier S/A compares and amplifies a reference current Iref of a reference line R/L with a data current Idata of the data bus unit 600. The sense amplifier S/A has a terminal connected to the data bus 600 so as to receive the cell data current Idata. The sense amplifier S/A has the other terminal connected to the reference line R/L so s to receive the reference current Iref. The reference current generating unit 800 generates the reference current Iref in the reference line R/L.

Figure 22:
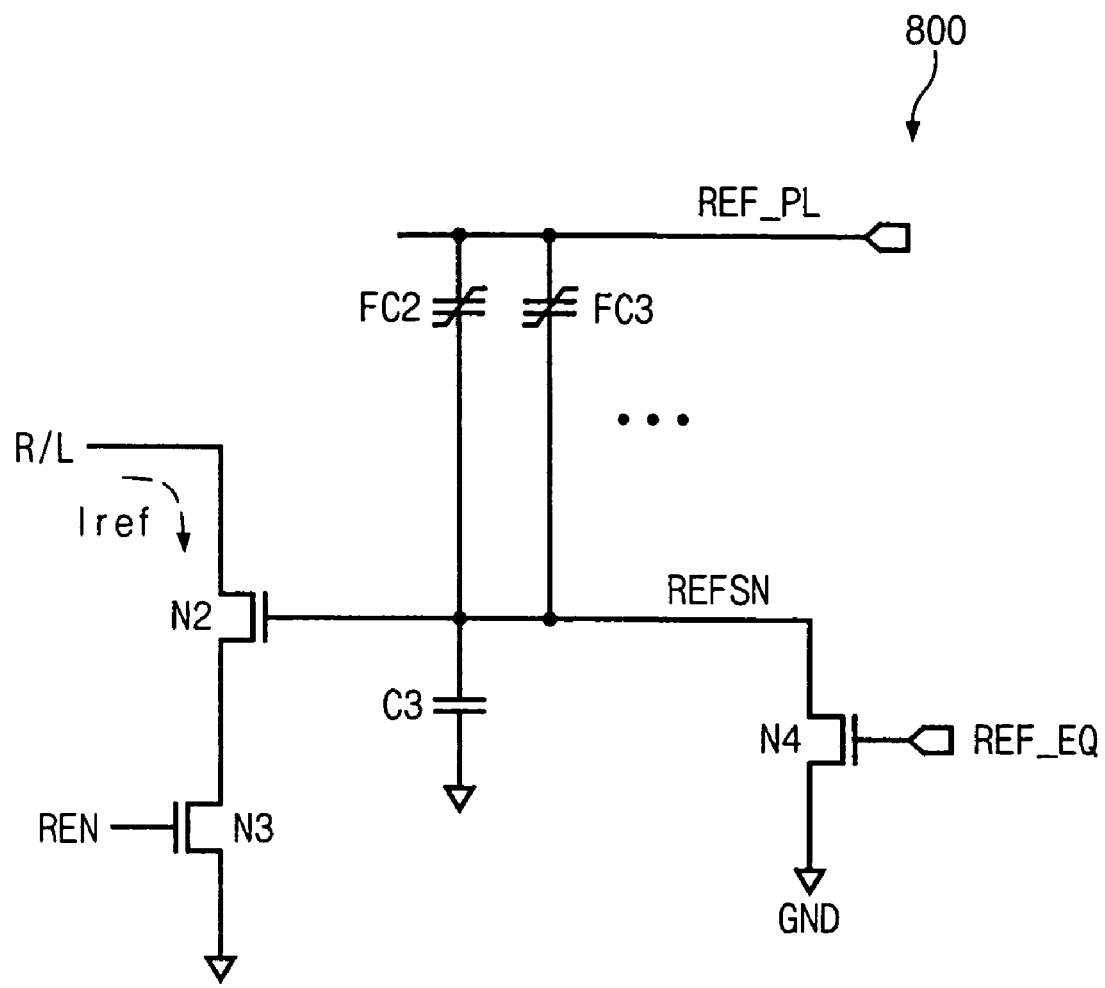
FIG. 22 is a circuit diagram illustrating a reference current generating unit of FIG. 21 consistent with the present invention.

FIG. 22 is a circuit diagram illustrating the reference current generating unit 800 of FIG. 21.

The reference current generating unit 800 includes a charging unit, a reference equalizing unit, a current generating unit and an activating unit. The charging unit includes a plurality of ferroelectric capacitors FC2, FC3 and a capacitor C3. The current generating unit includes a NMOS transistor N2. The activating unit includes a NMOS transistor N3. The reference equalizing unit includes a NMOS transistor N4.

The ferroelectric capacitors FC2, FC3 are connected between a reference plate line REF_PL and a reference sensing node REFSN in parallel. The NMOS transistor N2, connected between the reference line R/L and the NMOS transistor N3, has a gate connected to the reference sensing node REFSN. The NMOS transistor N3, connected between the NMOS transistor N2 and a ground voltage terminal, has a gate to receive the read enable signal REN.

The capacitor C3 is connected between the reference sensing node REFSN and the ground voltage terminal. The capacitor C3 is disposed for sub bit line SBL replica capacitance to form the same condition as that of the sub bit line SBL. The reference sensing node REFSN has a voltage level adjusted by the ferroelectric capacitors FC2, FC3 and the capacitor C3.

The NMOS transistor N4, connected between the reference sensing node REFSN and the ground voltage GND terminal, has a gate to receive a reference equalizing signal REF_EQ. During the precharge period, the reference equalizing signal REF_EQ is activated to a high level, thereby turning on the NMOS transistor N4 to precharge the reference sensing node REFSN to a low level.

Figure 23:
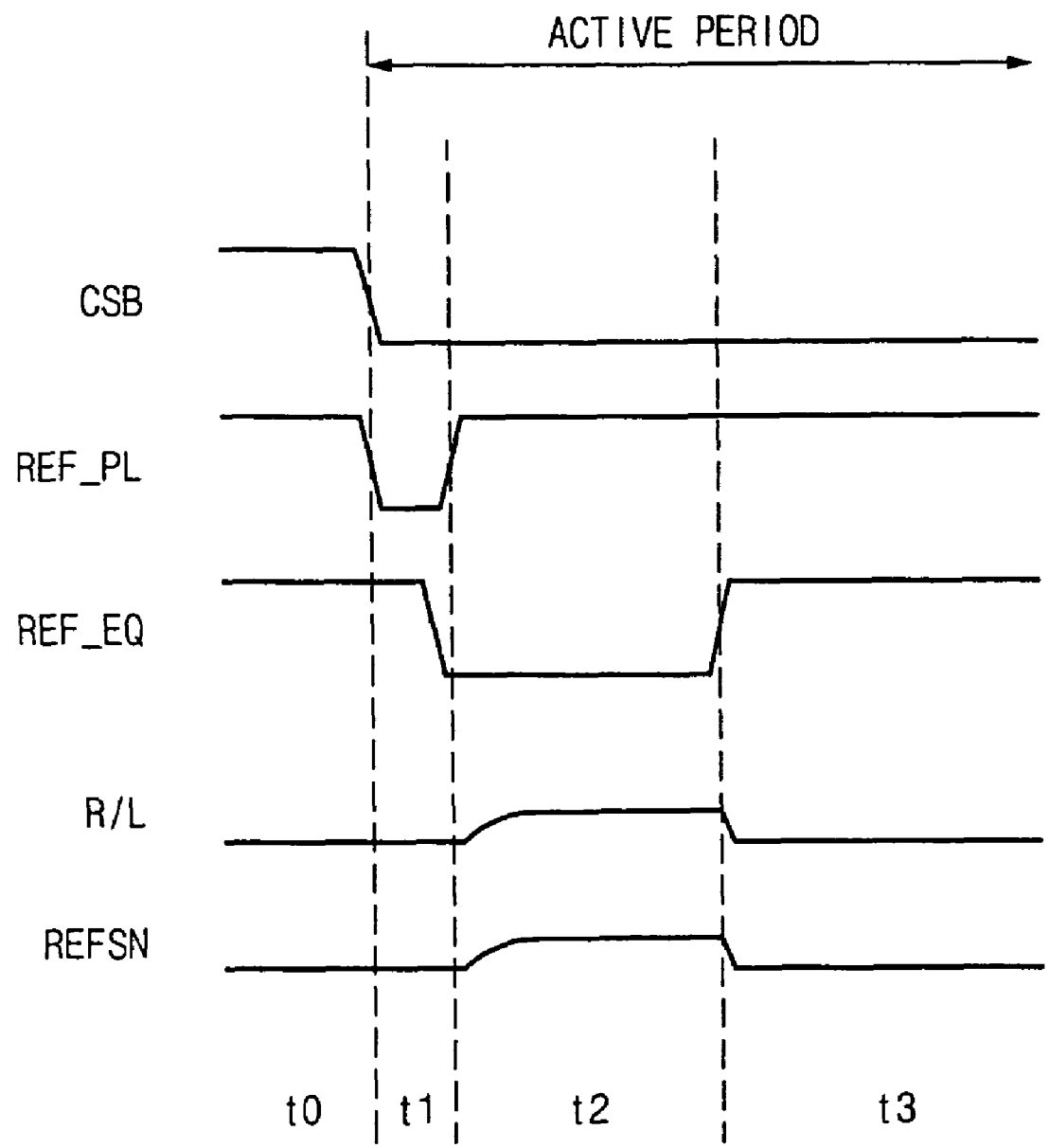
FIG. 23 is a timing diagram illustrating the operation of the reference current generating unit of FIG. 22 consistent with the present invention.

FIG. 23 is a timing diagram illustrating the operation of the reference current generating unit 800 of FIG. 22.

In a period t0, a column selecting signal CSB, the reference plate line REF_PL and the reference equalizing signal REF_EQ are maintained at a high level. The column selecting signal CSB is an inverted signal of the column selecting signal CS. The reference line R/L and the reference sensing node REFSN are maintained at a low voltage level.

As a result, the NMOS transistor N1 of the column switching unit 500 is kept off so that the main bit line MBL is disconnected with the data bus unit 600. The NMOS transistor N4 is turned on in response to the reference equalizing signal REF_EQ so that the reference sensing node REFSN becomes 'low'.

In an active period t1, the column selecting signal CSB transits to a low level. As a result, the NMOS transistor N1 of the column switching unit 500 is turned on so that the main bit line MBL is connected with the data bus unit 600. The data of the cell array block 400 are transmitted into the current sense amplifier array unit 700 through the main bit line MBL, the column switching unit 500 and the data bus unit 600.

The reference equalizing signal REF_EQ is kept 'high'. The NMOS transistor N4 is turned on so that the reference line R/L and the reference sensing node REFSN are kept 'low'. The reference plate line REF_PL transits to a low level. As a result, reference charges are charged in the ferroelectric capacitors FC2, FC3.

In a period t2, the column selecting signal CSB is kept 'low', and the reference plate line REF_PL transits to the high level again. The reference equalizing signal REF_EQ transits to a low level so that the NMOS transistor N4 is turned off. A given voltage flows in the reference sensing node REFSN depending on the reference charges charged in the ferroelectric capacitors FC2, FC3. As a result, the reference current Iref flows in the reference line R/L.

In a period t3, the column selecting signal CSB is kept 'low', and the reference plate line REF_PL is kept 'high'. The reference equalizing signal REF_EQ transits to the high level again. The NMOS transistor N4 is turned on to equalize the reference sensing node REFSN to the ground voltage level. As a result, a current does not flow in the reference line R/L and the reference sensing node REFSN.

Figure 24:
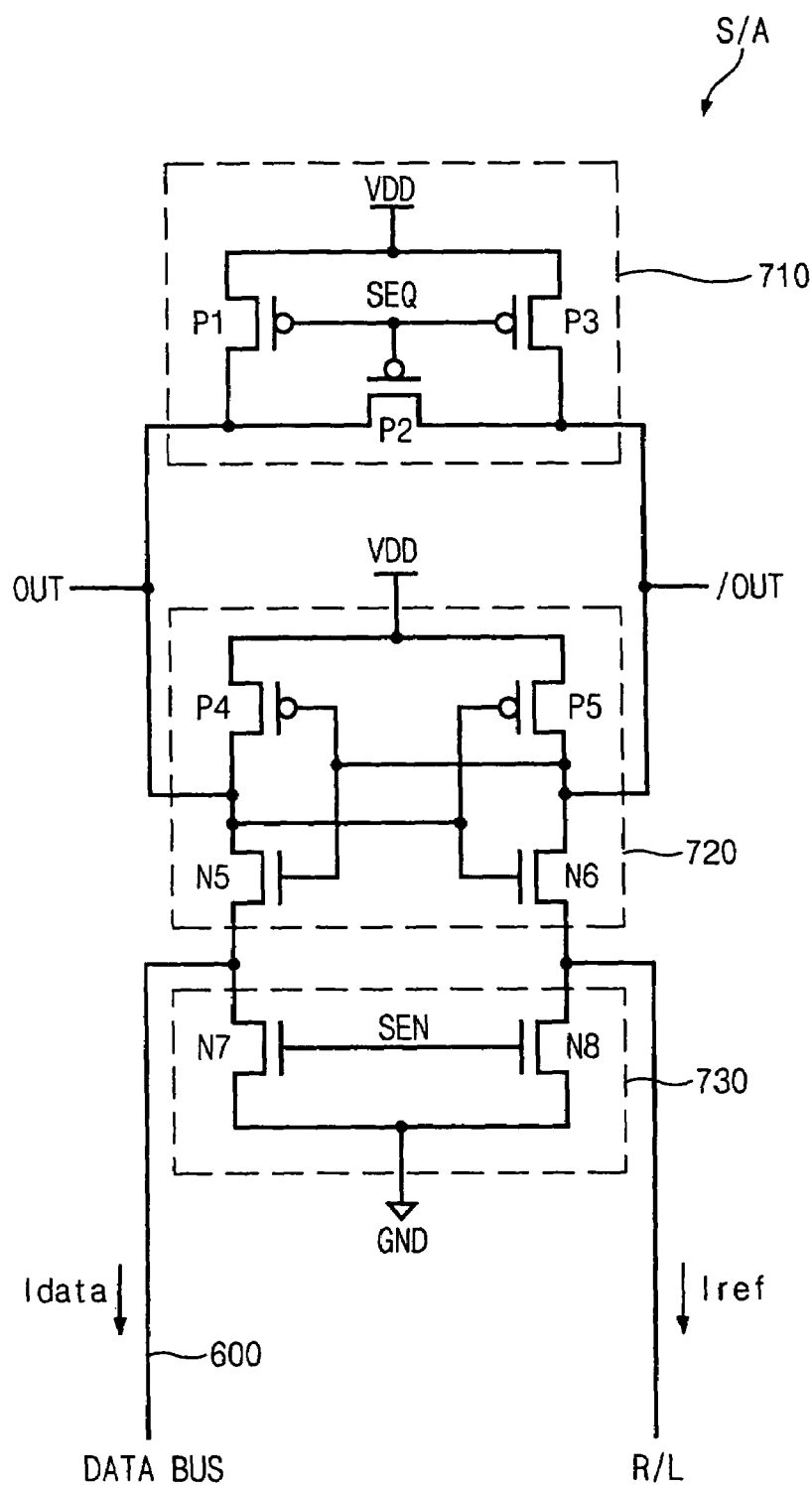
FIG. 24 is a circuit diagram illustrating a sense amplifier of FIG. 21 consistent with the present invention.

FIG. 24 is a circuit diagram illustrating the sense amplifier S/A of FIG. 21.

The sense amplifier S/A includes an equalizing unit 710, a latch unit 720 and an amplifying unit 730.

The equalizing unit 710 includes PMOS transistors P1~P3. The PMOS transistor P1 is connected between a power voltage VDD terminal and an output terminal OUT. The PMOS transistor P3 is connected between the power voltage VDD terminal and an output terminal /OUT. The PMOS transistor P2 is connected between the output terminals OUT, /OUT. The PMOS transistors P1~P3 has a common gate to receive a sense amplifier equalizing signal SEQ.

The latch unit 720 includes PMOS transistors P4, P5 and NMOS transistors N5, N6. The PMOS transistors P4, P5 and the NMOS transistors N5, N6 include cross-coupled latch amplifiers. The amplifying unit 730 includes NMOS transistors N7, N8. The NMOS transistor N7 is connected between the data bus unit 600 and the ground GND terminal. The NMOS transistor N8 is connected between the reference node R/N and the ground GND terminal. The NMOS transistor N7, N8 have a common gate to a sense amplifier enable signal SEN.

Figure 25:
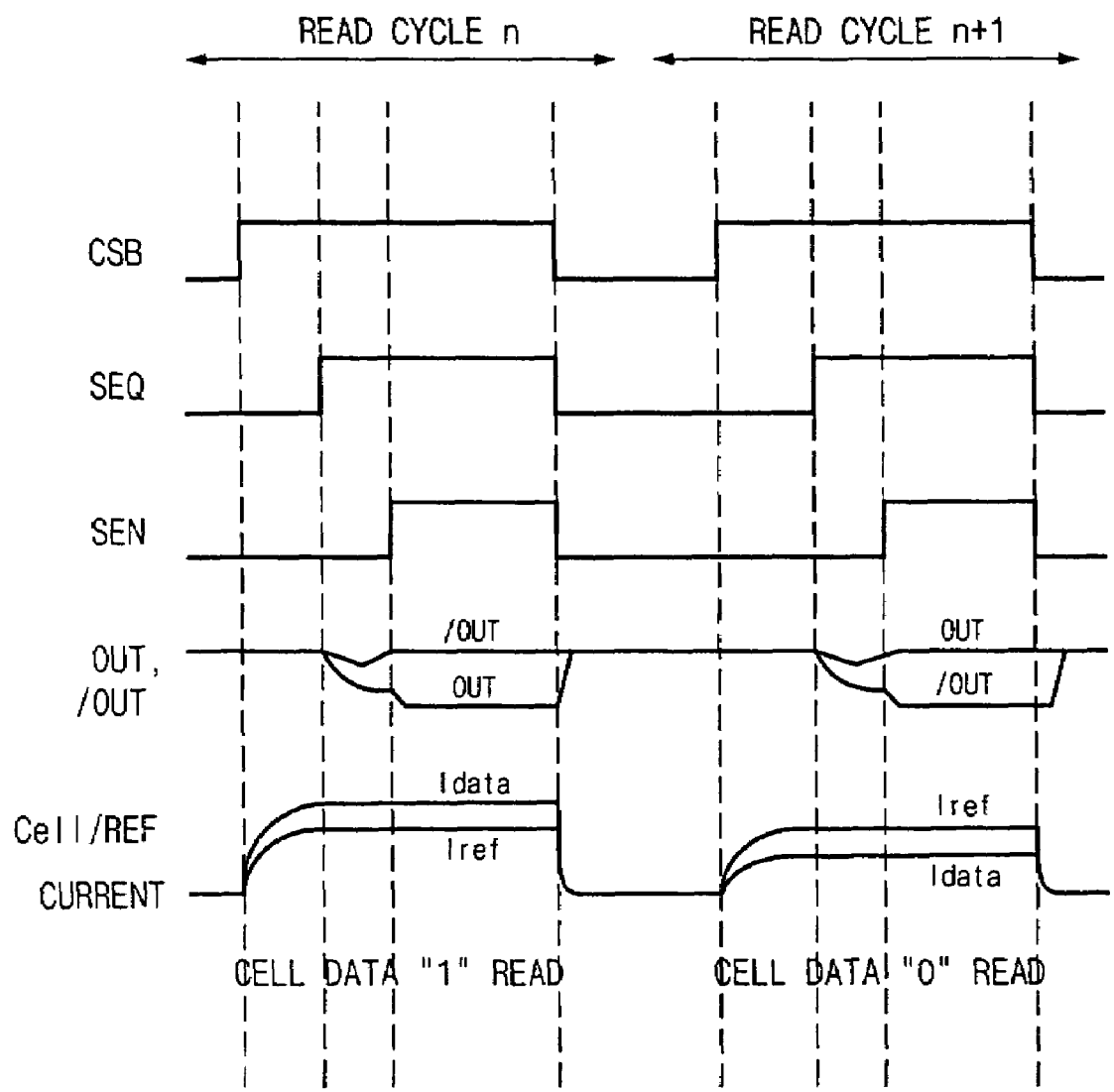
FIG. 25 is a timing diagram illustrating the operation of the current sense amplifier of FIG. 24 consistent with the present invention.

FIG. 25 is a timing diagram illustrating the operation of the current sense amplifier of FIG. 24. FIG. 25 shows the current sensing operation of the data "1" and "0" in two read cycles.

In a read cycle n, when the read enable signal REN is activated, the NMOS transistors N2, N3 are turned on so that the data current Idata and the reference current Iref flow. After a given time, when the equalizing signal SEQ is inactivated to a high level, the equalizing unit 710 is turned off to perform an amplifying operation.

After a given time, when the sense amplifier enable signal SEN is activated, a voltage of the output terminals OUT, /OUT is amplified to the maximum. A cell current Icell is larger than the reference current Iref so that an output signal of the output terminal OUT is outputted at a low level and an output signal of the output terminal /OUT is outputted at a high level.

In a read cycle n+1, when the read enable signal REN is activated, the NMOS transistors N2, N3 are turned on so that the data current Idata and the reference current Iref start to flow. When the sense amplifier equalizing signal SEQ is inactivated to a high level, the equalizing unit 710 is turned off to perform an amplifying operation.

After a given time, when sense amplifier enable signal SEN is activated, a voltage of the output terminals OUT, /OUT is amplified to the maximum. A cell current Icell is lower than the reference current Iref so that an output signal of the output terminal OUT is outputted at a high level and an output signal of the output terminal /OUT is outputted at a low level.

Figure 26:
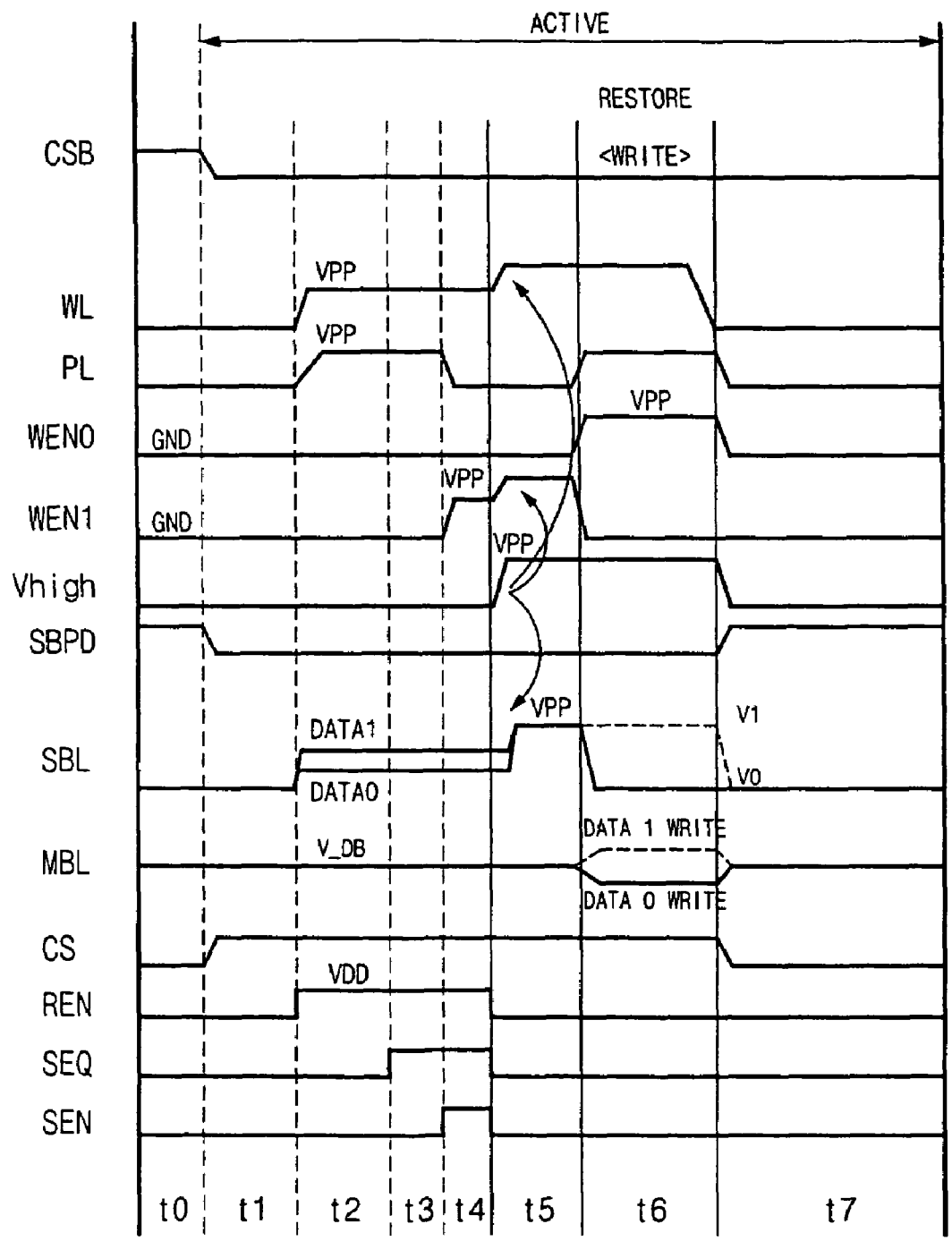
FIG. 26 is a timing diagram illustrating an operation of a semiconductor memory device consistent with the present invention.

FIG. 26 is a timing diagram illustrating an operation of a semiconductor memory device according to one embodiment.

In a precharge period t0, word line WL, the read enable signal REN, the column selecting signal CS and the write enable signals WEN0, WEN1 are maintained at the ground voltage GND level. The main bit line MBL maintain the data bus voltage V_DB level.

In a sensing period t1, the column selecting signal CSB transits to the low level, and the column selecting signal CS transits to the high level so that the NMOS transistor N1 of the column switching unit 500 is turned on. As a result, the cell array block 400 is connected to the data bus unit 600. The sub bit line pull-down signal SBPD transits to 'low' so that the NMOS transistor WT5 is kept off.

In a sensing period t2, in order to sense the data stored in the cell C, the word line WL and the plate line PL transit to the pumping voltage VPP level. The read enable signal REN transits to the power voltage VDD level to turn on the NMOS transistor RT4 of the sensing adjusting unit 410.

The write enable signals WEN0, WEN1 are maintained at the ground voltage GND level so that the restoring/writing adjusting unit 420 is not operated. The cell data current Idata and the reference current Iref flow. The data are read by the current flowing in the NMOS transistor RT3 differentiated depending on the voltage of the sub bit line SBL.

In a period t3, the sense amplifier equalizing signal SEQ transits to the high level to inactivate the equalizing unit 710. In a period t4, the sense amplifier enable signal SEN becomes 'high' to perform the amplifying operation of the sense amplifier S/A. The write enable signal WEN1 transits to the pumping voltage VPP level.

In a period t5, the high voltage Vhigh transits to the pumping voltage VPP level, and the voltage of the sub bit line SBL transits to the pumping voltage VPP level. The write enable signal WEN1 and the word line WL transit to a voltage level over the pumping voltage VPP level. After the sensing operation, the read enable signal REN transits to the ground voltage GND level so that the sensing adjusting unit 410 is not operated.

In a restore/write period t6, the high voltage Vhigh is maintained at the pumping voltage VPP level, and the word line WL is maintained at a voltage level over the pumping voltage VPP level. The write enable signal WEN0 transits to the pumping voltage VPP level so that the data "0" current IW0 flows towards the main bit line MBL depending on the voltage of the main bit line MBL.

When the data "1" is written in the cell C, the voltage of the main bit line MBL becomes the data "1" write voltage V1. The data "0" current IW0 does not flow in the main bit line MBL so that the value of the data "1" current IW1 is larger than that of the data "0" current IW0. The voltage level of the sub bit line SBL rises to the pumping voltage VPP level. As a result, the data "1" is restored or written in the cell C depending on the high voltage Vhigh applied to the sub bit line SBL.

When the data "0" is written in the cell C, the voltage of the main bit line MBL becomes the data "0" write voltage V0. The data "0" current IW0 flows in the main bit line MBL so that the value of the data "0" current IW0 is larger than that of the data "1" current IW1. The voltage level of the sub bit line SBL remains at the data bus voltage V_DB level. As a result, the data "0" is restored or written in the cell C depending on the data bus voltage V_DB applied to the sub bit line SBL.

The voltage of the main bit line MBL is maintained at the data bus voltage V_DB in the sensing mode. In the restore/write mode, the data "1" becomes the write voltage V1 and the data "0" becomes the write voltage V0.

In a precharge period t7, the word line WL, the read enable signal REN and the write enable signals WEN0, WEN1 are maintained at the ground voltage GND level. The sub bit line SBL and the main bit line MBL maintain the data bus voltage V_DB level.

Figure 27:
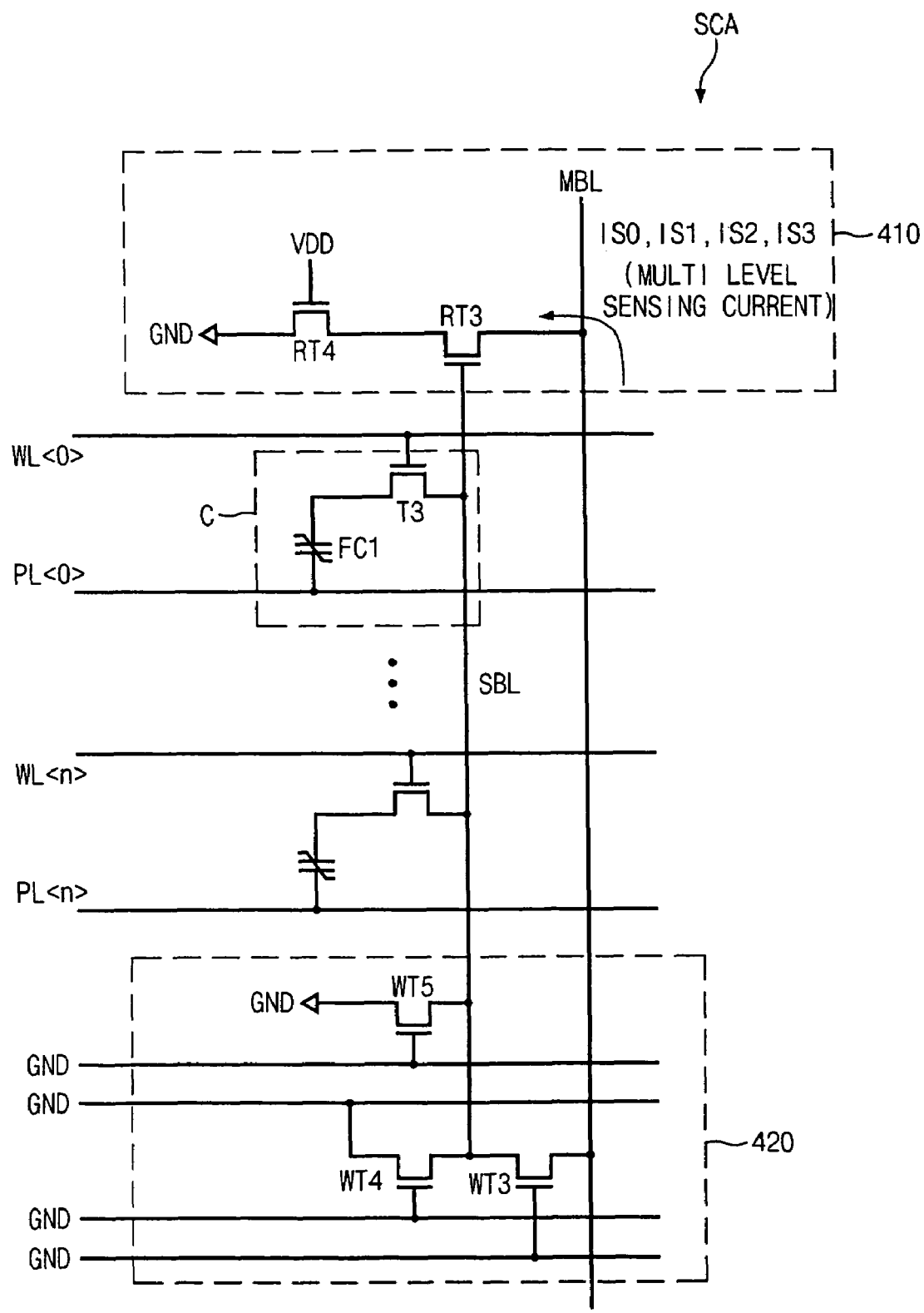
FIG. 27 is a diagram illustrating a semiconductor memory device consistent with the present invention.

FIG. 27 is a diagram illustrating the sensing mode operation of the sub-cell array SCA of FIG. 17.

In a sensing mode, the write enable signals WEN0, WEN1 are at the ground GND voltage level so that the NMOS transistors WT3, WT4 are kept inactivated. The sub bit line pull-down signal SBPD is at the ground GND voltage level so that the NMOS transistor WT5 is kept off. As a result, the restore/write adjusting unit 420 is not operated in the sensing mode.

In the sensing mode, the read enable signal REN is at a power voltage VDD level to activate the NMOS transistor RT4. A source of the NMOS transistor RT3 receives the ground voltage GND so that a plurality of sensing currents IS0~IS3 received from the main bit line MBL flow in the NMOS transistor RT3. As a result, values of the sensing currents IS0~IS3 flowing into the NMOS transistors RT3 are differentiated depending on the voltage level of the sub bit line SBL.

Although the four sensing current levels IS0~IS3 are shown in one embodiment the sensing current levels can be set at n levels.

A pumping voltage VPP is applied to the word line WL of the cell C to turn on the switching transistor T3. The cell data stored in the ferroelectric capacitor FC1 is transmitted to the sub bit line SBL.

When data "00" is stored in the cell C, the voltage of the sub bit line SBL becomes the lowest. As a result, the sensing current IS0 is sensed when a current of the data "00" flows in the NMOS transistor RT3.

When data "01" is stored in the cell C, the voltage of the sub bit line SBL becomes higher than that corresponding to the data "00". As a result, the sensing current IS1 is sensed when a current of the data "01" flows in the NMOS transistor RT3.

When data "10" is stored in the cell C, the voltage of the sub bit line SBL becomes higher than that corresponding to the data "01". As a result, the sensing current IS2 is sensed when a current of the data "10" flows in the NMOS transistor RT3.

When data "11" is stored in the cell C, the voltage of the sub bit line SBL becomes higher than that corresponding to the data "10". As a result, the sensing current IS3 is sensed when a current of the data "11" flows in the NMOS transistor RT3. The values of the sensing currents are set to be IS3>IS2>IS1>IS0. The sensing voltage of the main bit line MBL is supposed to be constant.

Figure 28:
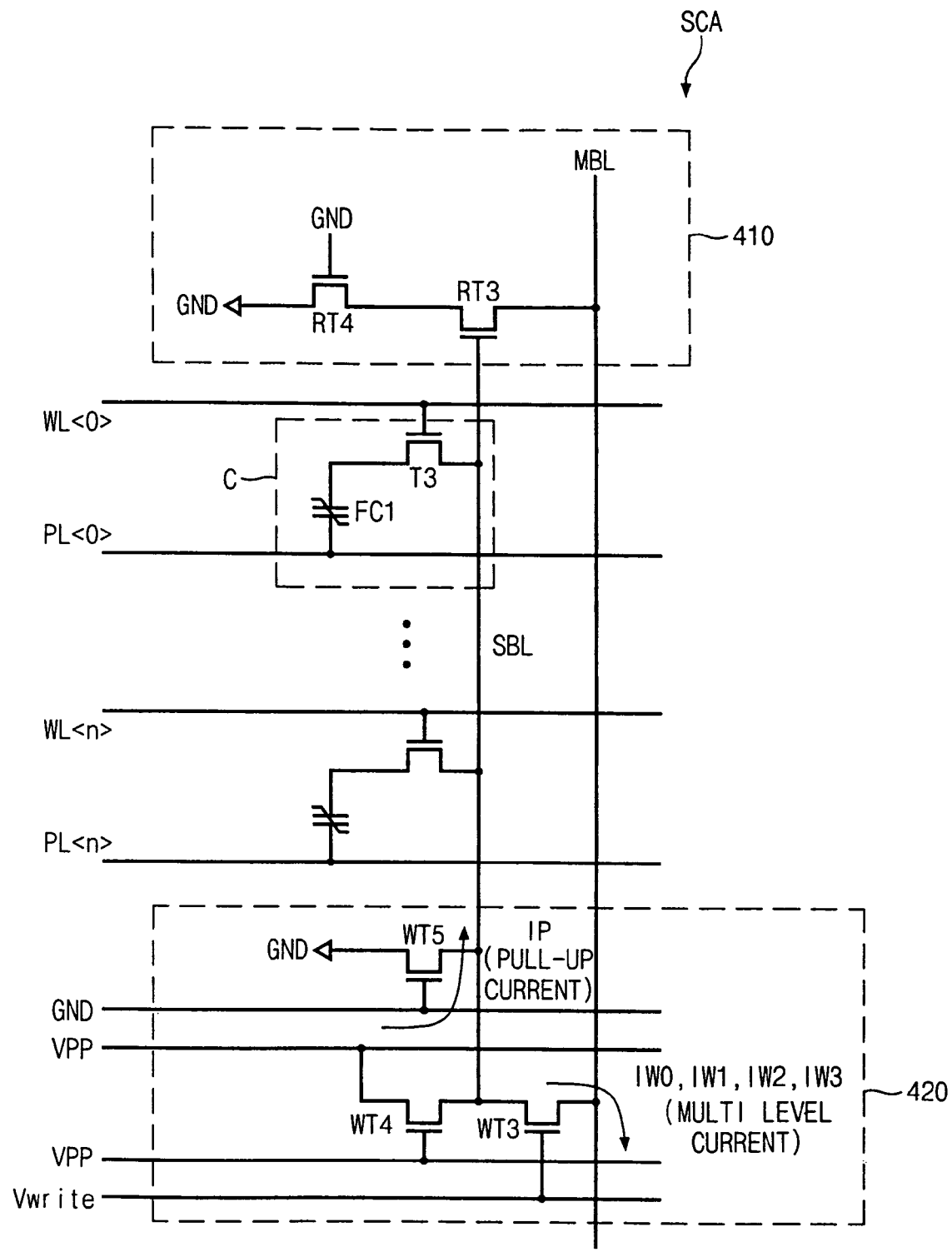
FIG. 28 is a diagram illustrating restore/write operations of a sub-cell array of FIG. 27 consistent with the present invention.

FIG. 28 is a diagram illustrating the restore/write operations in the sub-cell array SCA of FIG. 17.

After the multi level sensing operation, the read enable signal REN is at the ground GND voltage level so that the NMOS transistor RT4 is kept inactivated. In the restore/write mode, the sensing adjusting unit 410 is not operated.

In the multi level restore/write mode, the write enable signal WEN1 is at a pumping voltage VPP level to activate the NMOS transistor WT4. The high voltage Vhigh becomes at the pumping voltage VPP level. The NMOS transistor WT4 receives the pumping voltage VPP so that the pull-up current IP flows in the sub bit line SBL.

The write enable signal WEN0 is at the write voltage Vwrite. As a result, a plurality of multi level currents IW0~IW3 flow in the main bit line MBL through the NMOS transistor WT3.

The pumping voltage VPP is applied to the word line WL of the selected cell C to turn on the switching transistor T3. As a result, the cell data can be stored in the ferroelectric capacitor FC1 depending on a voltage applied to the sub bit line SBL.

When the data "00" is written in the cell C, the voltage of the main bit line MBL becomes a data "00" write voltage V00. The write enable signal WEN0 is at the write voltage Vwrite level. The current IW0 flows in the main bit line MBL depending on a level difference between the data "00" write voltage V00 and the high voltage Vhigh. That is, the NMOS transistor WT3 is turned on so that the data "00" current IW0 flows in the main bit line MBL.

When the data "01" is written in the cell C, the voltage of the main bit line MBL becomes a data "01" write voltage V01. The write enable signal WEN0 is at the write voltage Vwrite level. As a result, a current IW1 flows in the main bit line MBL depending on a level difference between the data "01" write voltage V01 and the high voltage Vhigh. That is, the NMOS transistor WT3 is turned on to flow the data "01" current IW1 in the main bit line MBL.

When the data "10" is written in the cell C, the voltage of the main bit line MBL becomes a data "10" write voltage V10. The write enable signal WEN0 is at the write voltage Vwrite level. As a result, a current IW2 flows in the MBL depending on a level difference between the data "10" write voltage V10 and the high voltage Vhigh. That is, the NMOS transistor WT3 is turned on to flow the data "10" current IW2 in the main bit line MBL.

When the data "11" is written in the cell C, the voltage of the main bit line MBL becomes a data "11" write voltage V11. The write enable signal WEN0 is at the write voltage Vwrite level. As a result, a current IW3 flows in the MBL depending on a level difference between the data "11" write voltage V11 and the high voltage Vhigh in the main bit line MBL.

The plurality of write voltages V00~V11 received from the main bit line MBL are values obtained by feeding-back the corresponding voltages to data values after the operation of the sense amplifier S/A in the main bit line MBL. The current values flowing in the main bit line MBL are set to be IW0>IW1>IW2>IW3.

When the data "00" current IW0 flows in the main bit line MBL, the data "00" is restored or written. When the data "01" current IW1 flows in the main bit line MBL, the data "01" is restored or written. When the data "10" current IW2 flows in the main bit line MBL, the data "10" is restored or written. When the data "11" current IW3 flows in the main bit line MBL, the data "11" is restored or written.

In one embodiment, the data are written not by pull-up/pull-down operations but by a voltage level adjusting method. As a result, the swing of the voltage of the main bit line is reduced in the write mode to reduce power consumption.

Figure 29:
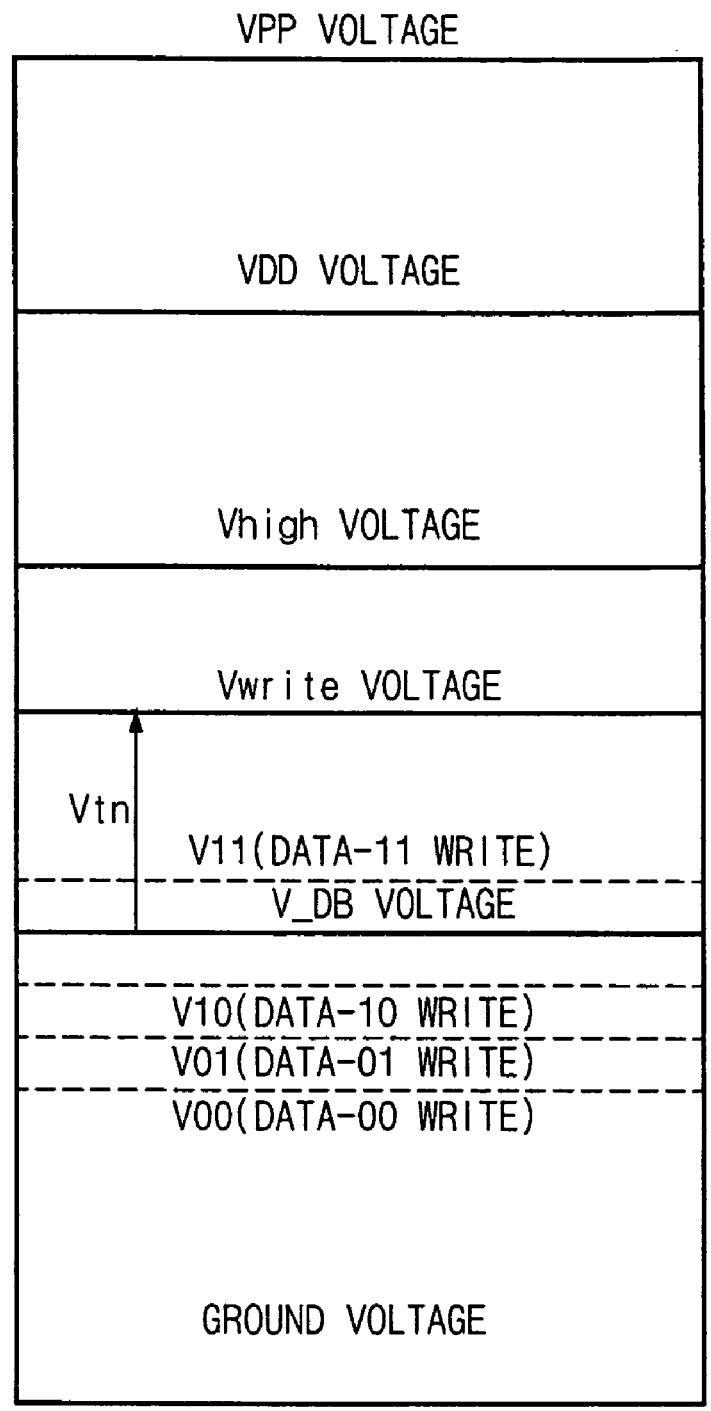
FIG. 29 is a diagram illustrating a relation of an operating voltage of FIG. 27 consistent with the present invention.

FIG. 29 is a diagram illustrating the relation of the operating voltage of FIG. 27.

The data "00" write voltage V00 for writing the data "00" in the cell C has a level higher than that of the ground voltage GND. The data "01" write voltage V01 for writing the data "01" in the cell C has a level higher than that of the write voltage V00. The data "10" write voltage V10 for writing the data "10" in the cell C has a level higher than that of the write voltage V01. The data bus voltage V_DB has a level higher than that of the data "10" write voltage V10. The data "11" write voltage V11 for writing the data "11" in the cell C has a level than that of the data bus voltage V_DB.

The write voltage Vwrite has a level higher than that of the data "11" write voltage V11. The write voltage Vwrite has a value larger than the data bus voltage V_DB by a threshold voltage Vtn of the NMOS transistor WT3 to turn on the NMOS transistor WT3.

The high voltage Vhigh has a level higher than that of the write voltage Vwrite. The power voltage VDD has a level higher than that of the high voltage Vhigh. The pumping voltage VPP has a level higher than that of the power voltage VDD.

Figure 30:
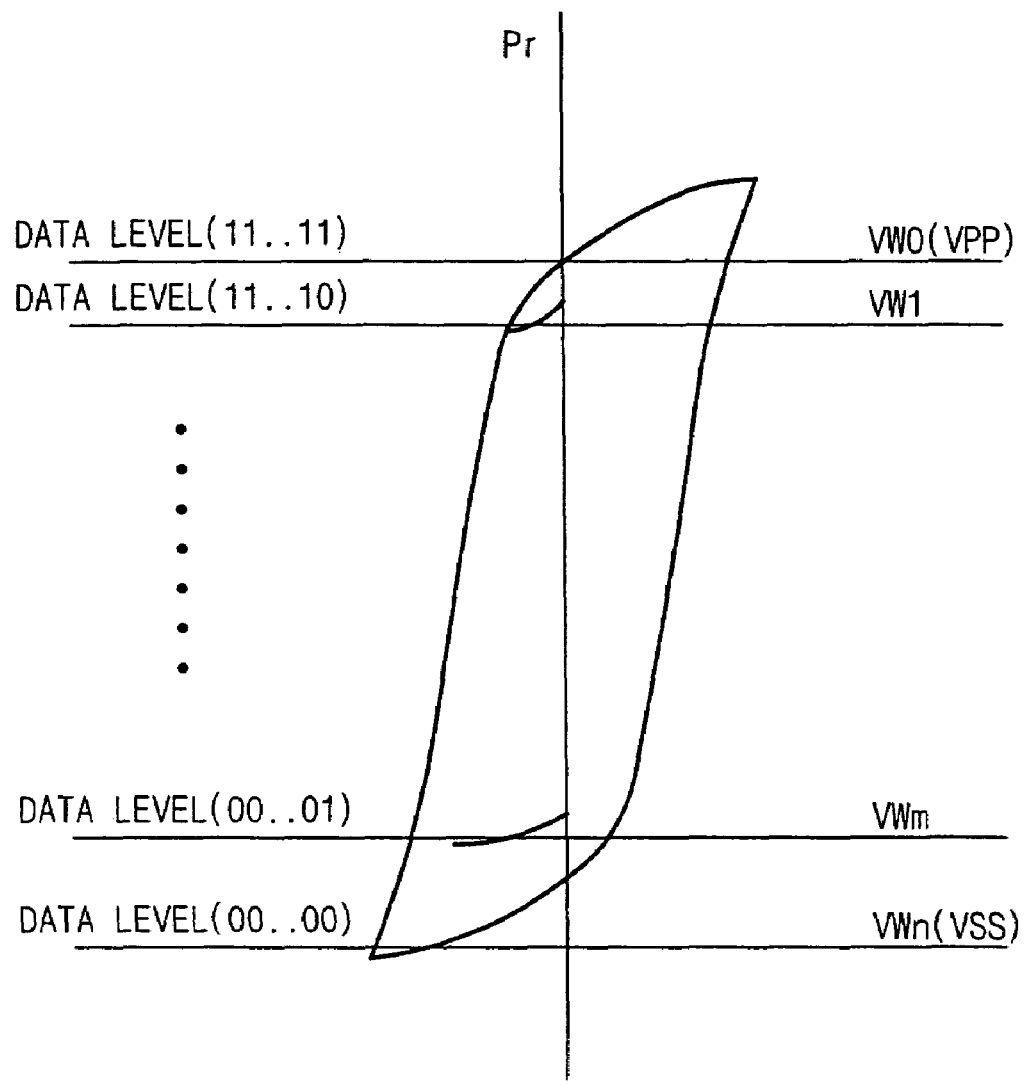
FIG. 30 is a diagram illustrating a n-bit write level of the semiconductor memory device of FIG. 27 consistent with the present invention.

FIG. 30 is a diagram illustrating a n-bit write level of the semiconductor memory device of FIG. 27.

$2^n$ level data are required in order to store n bit data in the cell. For example, $4(2^2)$ level data are required in order to store 2 bit data in the memory cell. That is, data level of 00, 01, 10, 11 are required. Voltage levels are divided into VW0 (VPP), VW1, VWm, VWn(VSS) for storing 4 level data in the cell, and transmitted in each main bit line MBL.

Figure 31:
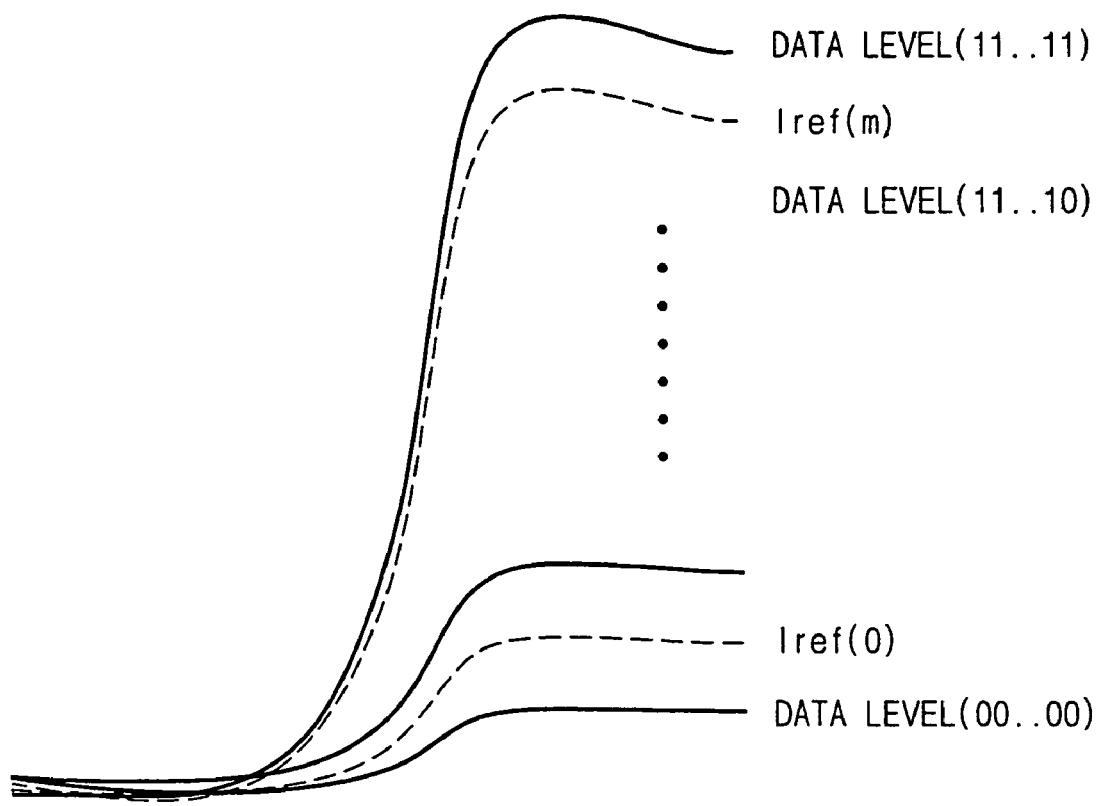
FIG. 31 is a diagram illustrating a n-bit sensing current level of the semiconductor memory device of FIG. 27 consistent with the present invention.

FIG. 31 is a diagram illustrating a n-bit sensing current level of the semiconductor memory device of FIG. 27.

A plurality of sensing voltage levels are outputted into the sub bit line SBL depending on voltage levels of the data stored in the cell array block 400. The sensing voltages of the sub bit line SBL are represented by 11 . . . 11, 11 . . . 10, ~00 . . . 00 of $2^n$ data levels in the main bit line MBL.

The $2^n$ level data are compared and amplified with different reference voltages Iref(m)~Iref(0) in the current sense amplifier array unit 700. When the data levels are $2^n$, the reference levels are $2^n-1$.

Figure 32:
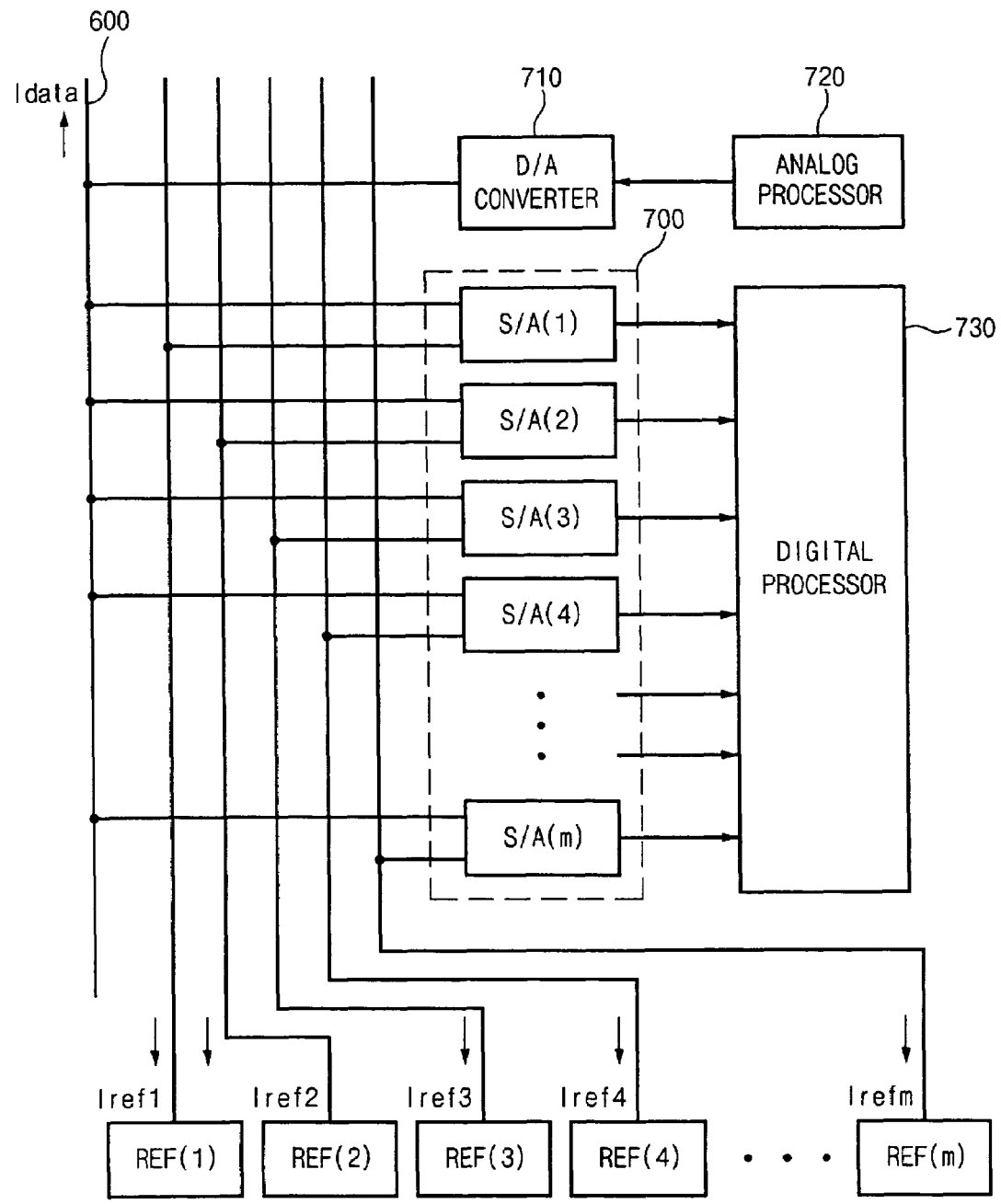
FIG. 32 is a diagram illustrating a current sense amplifier array unit of FIG. 27 consistent with the present invention.

FIG. 32 is a diagram illustrating the current sense amplifier array unit 700 of FIG. 27.

The digital-analog (D/A) converter 710 converts a code input signal received from the analog processor 720 into analog data so as to output the analog data into the data bus unit 600. The analog processor 720 as an analog input processor generates an input code for generating an analog output signal in the D/A converter 710.

The sense amplifier array unit 700 includes a plurality of sense amplifiers S/A1~S/Am so as to sense a plurality of read data as a plurality of data levels. When the data stored in the cell array block 400 is n bit, the number of sense amplifiers S/A is $2^n-1$, and the number of reference voltage generating units REF1~REFm is $2^n1-1$.

The sense amplifiers S/A1~S/Am compare a plurality of data level voltages received from the data bus unit 600 with a plurality of reference voltages REF1~REFm so as to output the reference voltages into the digital processor 730. Each of the reference voltages REF1~REFm are generated by the reference current generating unit 800 of FIG. 21.

Sensing threshold voltages of the sense amplifiers S/A1~S/Am are set to have different values. That is, the lowest sensing threshold voltage is set in the sense amplifier S/A1, the second lowest sensing threshold voltage is set in the sense amplifier S/A2, and the highest sensing threshold voltage is set in the sense amplifier S/Am.

When 2 bit data are sensed, three sense amplifiers S/A1~S/A3 are required. In the sense amplifier S/A1, the data "11" is distinguished from the data "10". In the sense amplifier S/A2, the data "10" is distinguished from the data "01". In the sense amplifier S/A3, the data "01" is distinguished from the data "00".

In the read mode, an output signal of the sense amplifier S/A is outputted into the digital processor 730, and encoded to output n data. In the restore/write mode, data outputted from the digital processor 730 is fed-back in the analog processor 720. Through the D/A converter 710, $2^n$ write voltages VW0~VWn are transmitted into the cell array block 400 by the data bus 600.

Figure 33:
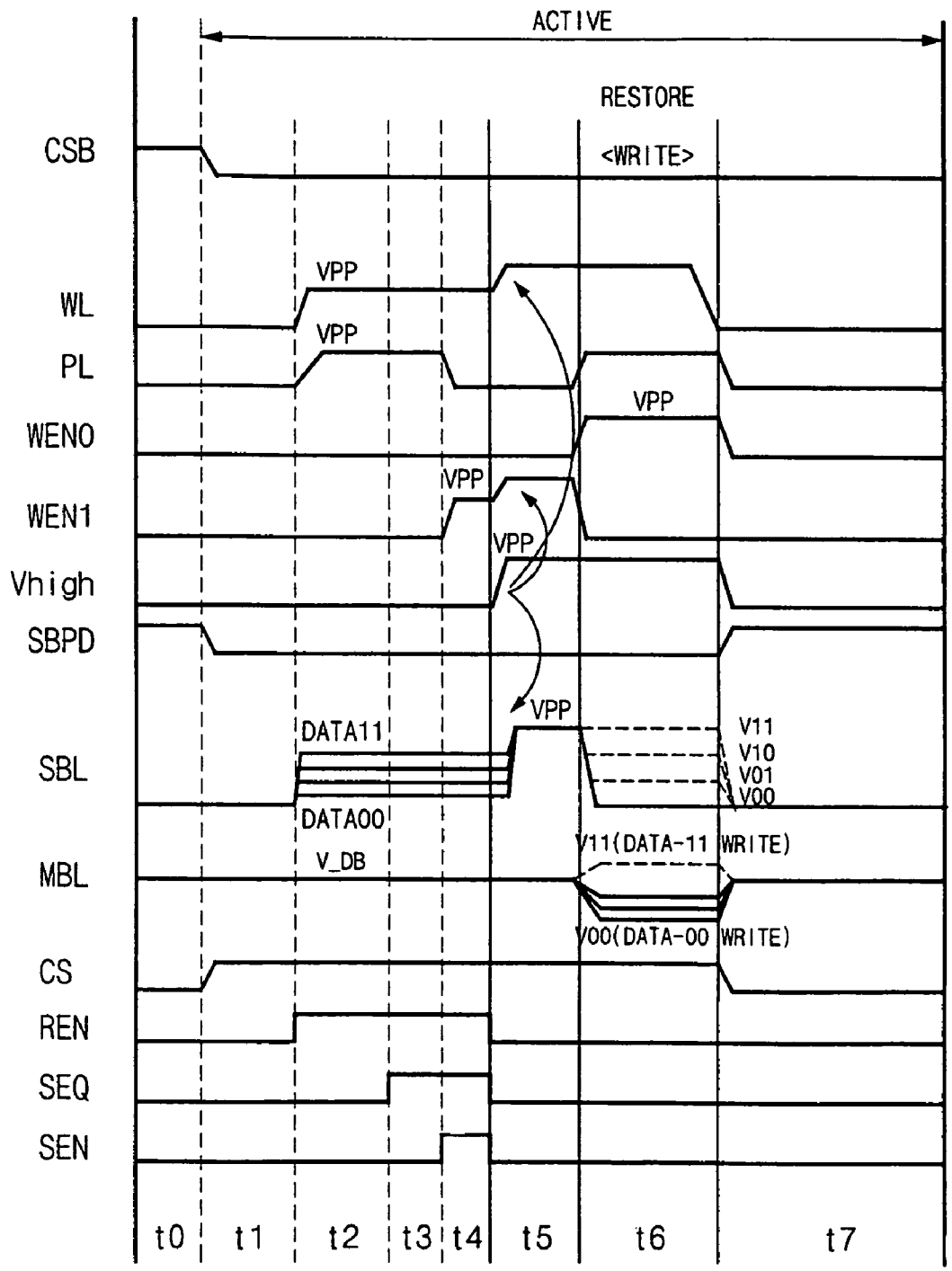
FIG. 33 is a timing diagram illustrating the operation of the semiconductor memory device of FIG. 27 consistent with the present invention.

FIG. 33 is a timing diagram illustrating the operation of the semiconductor memory device of FIG. 27.

In a precharge period t0, the word line WL, the read enable signal REN, the column selecting signal CS and the write enable signals WEN0, WEN1 are maintained at the ground voltage GND level. The main bit line MBL maintain the data bus voltage V_DB level.

In a sensing period t1, the column selecting signal CSB transits to the low level, and the column selecting signal CS transits to the high level so that the NMOS transistor N1 of the column switching unit 500 is turned on. As a result, the cell array block 400 is connected to the data bus unit 600. The sub bit line pull-down signal SBPD transits to 'low' so that the NMOS transistor WT5 is kept off.

In a sensing period t2, in order to sense the data stored in the cell C, the word line WL and the plate line PL transit to the pumping voltage VPP level. The read enable signal REN transits to the power voltage VDD level to turn on the NMOS transistor RT4 of the sensing adjusting unit 410.

The write enable signals WEN0, WEN1 are maintained at the ground voltage GND level so that the restoring/writing adjusting unit 420 is not operated. The cell data current Idata and the reference current Iref flow. The multi data are read by the plurality of current flowing in the NMOS transistor RT3 differentiated depending on the voltage of the sub bit line SBL.

In a period t3, the sense amplifier equalizing signal SEQ transits to the high level to inactivate the equalizing unit 710. In a period t4, the sense amplifier enable signal SEN becomes 'high' to perform the amplifying operation of the sense amplifier S/A. The write enable signal WEN1 transits to the pumping voltage VPP level.

In a period t5, the high voltage Vhigh transits to the pumping voltage VPP level, and the voltage of the sub bit line SBL transits to the pumping voltage VPP level. The write enable signal WEN1 and the word line WL transit to a voltage level over the pumping voltage VPP level. After the sensing operation, the read enable signal REN transits to the ground voltage GND level so that the sensing adjusting unit 410 is not operated.

In a restore/write period t6, the high voltage Vhigh is maintained at the pumping voltage VPP level, and the word line WL is maintained at a voltage level over the pumping voltage VPP level. The write enable signal WEN0 transits to the pumping voltage VPP level so that the write voltages V11, V10, V01, V00 are transmitted into the main bit line MBL. As a result, the data "00" current IW0, the data "01" current IW1, the data "10" current IW2 and the data "11" current IW3 flow towards the main bit line MBL.

When the data "11" is written in the cell C, the voltage of the main bit line MBL becomes the data "11" write voltage V11. When the data "10" is written in the cell C, the voltage of the main bit line MBL becomes the data "10" write voltage V10. When the data "01" is written in the cell C, the voltage of the main bit line MBL becomes the data "01" write voltage V01. When the data "00" is written in the cell C, the voltage of the main bit line MBL becomes the data "00" write voltage V00.

The voltage of the main bit line MBL is maintained at the data bus voltage V_DB in the sensing mode. In the restore/write mode, the voltage of main bit line MBL becomes the data "11" write voltage V11, the data "10" write voltage V10 or the data "01" write voltage V01, and the data "00" write voltage "00".

When the write voltages V00, V01, V10 are transmitted into the main bit line MBL, the NMOS transistor WT3 is turned on to flow current. When the write voltage V11 is transmitted into the main bit line MBL, the NMOS transistor WT4 is turned off so that a current does not flow.

In a precharge period t7, the word line WL, the read enable signal REN and the write enable signals WEN0, WEN1 are maintained at the ground voltage GND level. The sub bit line SBL and the main bit line MBL maintain the data bus voltage V_DB level.

As described above, according to embodiments consistent with the present invention, a semiconductor memory device includes a memory cell having a hierarchical bit line structure for large capacitor of memory.

The semiconductor memory device may be configured to read/write data by a current sensing method for a high speed operation.

The semiconductor memory device may be configured to read/write multi data by a current sensing method for a high speed operation.

The semiconductor memory device may be configured to read/write multi data by a current sensing method so that a plurality of data are stored in a cell.

The semiconductor memory device may be configured to read/write data by a current sensing method so as to reduce charge and discharge currents in bit lines, thereby obtaining a lower power circuit.

The semiconductor memory device may be configured to read/write multi data by a current sensing method so as to reduce charge and discharge currents in bit lines, thereby obtaining a lower power circuit.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor memory device comprising:
   a unit cell configured to read/write data;
   a cell data sensing unit for sensing data, and configured to adjust a current amount of a main bit line depending on a sensing voltage of a sub bit line when the data are sensed; and
   a write control unit configured to store the data in a corresponding unit cell depending on a current level applied from the main bit line to the sub bit line.

2. The semiconductor memory device according to claim 1, wherein the cell data sensing unit includes:
   a sensing unit configured to convert the sensing voltage of the sub bit line into a current so as to transmit the current into the main bit line; and
   a first switching unit configured to selectively activate the sensing unit in response to a read enable signal.

3. The semiconductor memory device according to claim 1, wherein the write control unit further includes a high voltage generating unit configured to supply a cell activating voltage to a bank including the unit cell in a write mode.

4. The semiconductor memory device according to claim 1, wherein the write control unit includes a voltage supplying unit configured to selectively supply a cell activating voltage to the sub bit line in response to a second write enable signal.

5. The semiconductor memory device according to claim 4, wherein the write control unit further includes a second switching element configured to selectively connect the main bit line to the sub bit line in response to a first write enable signal.

6. The semiconductor memory device according to claim 4, wherein the second write enable signal is activated to a pumping voltage level in a restore/write mode, the pumping voltage level being higher than a power voltage level.

7. A semiconductor memory device comprising a capacitor and a switching element and configured to perform read/write operations of data, the memory device comprising:
   a sub-cell array having a hierarchical bit line structure including a main bit line and a sub bit line connected to a plurality of unit cells for storing the data, wherein the sub cell array includes:
   a sensing adjusting unit configured to sense a plurality of sensing currents applied to the main bit line depending on a plurality of sensing voltages applied to the sub bit line when multi data having a multi levels are sensed;
   the plurality of unit cells each configured to read/write the plurality of data; and
   a restoring and writing adjusting unit configured to selectively apply a multi level current to the sub bit line depending on a plurality of write voltages applied to the main bit line so as to store the plurality of data in the corresponding unit cell.

8. The semiconductor memory device according to claim 7, wherein the restoring/writing adjusting unit transmits a first write voltage into the main bit line when first data is written so that a first current is applied to the sub bit line, and a second write voltage into the main bit line when second data is written so that a second current higher than the first current is transmitted to the sub bit line.

9. The semiconductor memory device according to claim 8, wherein the second write voltage has a level that is lower than a low voltage level and higher than a ground voltage level.

10. The semiconductor memory device according to claim 9, wherein the first write voltage has a level higher than the low voltage level and lower than the write voltage level.

11. A semiconductor memory device comprising:
a unit cell configured to read/write data through a ferroelectric capacitor;
a cell data sensing unit configured to adjust a current amount of a main bit line depending on a sensing voltage of a sub bit line when the data are sensed;
a write control unit configured to store the data in a corresponding unit cell depending on a current level applied from the main bit line to the sub bit line; and
a sense amplifier configured to compare and amplify a reference current with a data current received from the main bit line.

12. The semiconductor memory device according to claim 11, wherein the cell data sensing unit includes:
a sensing unit configured to convert the sensing voltage of the sub bit line into a current so as to transmit the current to the main bit line; and
a first switching unit configured to selectively activate the sensing unit in response to a read enable signal.

13. The semiconductor memory device according to claim 11, wherein the write control unit includes:
a voltage supply unit configured to selectively supply a cell activating voltage to the sub bit line in response to a second write enable signal; and
a second switching unit configured to selectively connect the main bit line to the sub bit line in response to a first write enable signal.

14. The semiconductor memory device according to claim 13, wherein the cell activating voltage has a pumping voltage level.

15. The semiconductor memory device according to claim 11, wherein the write control unit transmits a first write voltage, which is lower than a data bus voltage level and higher than a ground voltage level, into the main bit line when first data is written.

16. The semiconductor memory device according to claim 15, wherein the write control unit transmits a second write voltage, which is higher than the data bus voltage level and lower than a write voltage level, into the main bit line when second data is written.

17. The semiconductor memory device according to claim 16, wherein the first write voltage and the second write voltage are voltage values fed back from the sense amplifier to the main bit line.

18. The semiconductor memory device according to claim 11, wherein the sense amplifier includes:
an equalizing unit configured to equalize an output terminal of the sense amplifier in response to a sense amplifier equalizing signal;
a latch unit configured to latch a voltage of the output terminal; and
an amplifying unit configured to amplify the data current and the reference current in response to a sense amplifier enable signal.

19. The semiconductor memory device according to claim 11, further comprising a reference current generating unit configured to generate the reference current to the sense amplifier.

20. The semiconductor memory device according to claim 19, wherein the reference current generating unit includes:
a reference equalizing unit configured to pull-down a reference sensing node in response to a reference equalizing signal;
a charging unit configured to charge the reference sensing node;
a current generating unit configured to generate the reference current depending on a voltage level of the reference sensing node; and
an activating unit configured to control activation of the current generating unit.

21. The semiconductor memory device according to claim 20, wherein the charging unit includes:
a plurality of ferroelectric capacitors connected in parallel between the reference sensing node and a reference plate line; and
a capacitor connected between the reference sensing node and a ground voltage terminal.

22. The semiconductor memory device according to claim 20, wherein the current generating unit includes a sixth NMOS transistor connected between a reference line and the activating unit, the sixth NMOS transistor having a gate connected to the reference sensing node.

23. A semiconductor memory device comprising:
a unit cell configured to read/write multi-level data having multi levels through a ferroelectric capacitor;
a cell data sensing unit configured to adjust a plurality of sensing current applied to a main bit line depending on a plurality of sensing voltages applied to a sub bit line when the multi level data are sensed so as to induce a sensing voltage of the main bit line;
a write control unit configured to selectively transmit a multi-level current into the sub bit line depending on a plurality of write voltages received from the main bit line so as to store the multi-level data in the corresponding unit cell; and
a plurality of sense amplifiers each configured to compare and amplify a plurality of reference currents with the plurality of sensing currents received from the main bit line.

24. The semiconductor memory device according to claim 23, further comprising:
an analog processor configured to generate a code signal for outputting an analog signal;
a D/A converter configured to convert a digital signal into an analog signal in response to the code signal so as to output the analog signal into the main bit line; and
a digital processor configured to convert an output signal of the sense amplifier into a digital signal.

* * * * *